(12) United States Patent
Iijima

(10) Patent No.: US 12,224,242 B2
(45) Date of Patent: Feb. 11, 2025

(54) SEMICONDUCTOR MEMORY DEVICE

(71) Applicant: Kioxia Corporation, Tokyo (JP)

(72) Inventor: Natsuki Iijima, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 493 days.

(21) Appl. No.: 17/643,285

(22) Filed: Dec. 8, 2021

(65) Prior Publication Data

US 2022/0399274 A1    Dec. 15, 2022

(30) Foreign Application Priority Data

Jun. 14, 2021 (JP) ................. 2021-098827

(51) Int. Cl.
| | | |
|---|---|---|
| *H01L 23/535* | (2006.01) | |
| *H01L 23/522* | (2006.01) | |
| *H01L 23/528* | (2006.01) | |
| *H10B 41/27* | (2023.01) | |
| *H10B 43/27* | (2023.01) | |

(52) U.S. Cl.
CPC ........ *H01L 23/535* (2013.01); *H01L 23/5226* (2013.01); *H01L 23/5283* (2013.01); *H10B 41/27* (2023.02); *H10B 43/27* (2023.02)

(58) Field of Classification Search
CPC ........ H10B 43/20–50; H10B 43/10–50; H10B 41/10–70; H10B 20/10–50; H01L 23/535; H01L 23/5226; H01L 23/5283; H01L 2924/1434–1453

See application file for complete search history.

(56) References Cited

U.S. PATENT DOCUMENTS

| | | | |
|---|---|---|---|
| 9,793,293 B1 | 10/2017 | Horibe et al. | |
| 2017/0077131 A1* | 3/2017 | Konagai | H01L 21/76879 |
| 2019/0393236 A1* | 12/2019 | Kaneko | H10B 43/50 |
| 2021/0043640 A1 | 2/2021 | Kawaguchi et al. | |

* cited by examiner

*Primary Examiner* — Amar Movva
*Assistant Examiner* — Eric Manuel Mulero Flores
(74) *Attorney, Agent, or Firm* — Oblon, McClelland, Maier & Neustadt, L.L.P.

(57) ABSTRACT

A semiconductor memory device according to an embodiment includes: a first conductive layer; a stacked body including a plurality of second conductive layers and a plurality of first insulating layers alternately stacked one by one above the first conductive layer, and including a stepped portion in which the plurality of second conductive layers is terraced; and a plate-like portion including a third conductive layer that extends in the stacked body from the stepped portion to a memory region continuously in a stacking direction and in a first direction, the plate-like portion dividing the stacked body in a second direction that crosses both the stacking direction and the first direction. The plate-like portion includes, in the stepped portion, a plurality of contact portions that is arranged intermittently in the first direction, the plurality of contact portions penetrating the stacked body and connecting with the first conductive layer.

20 Claims, 18 Drawing Sheets

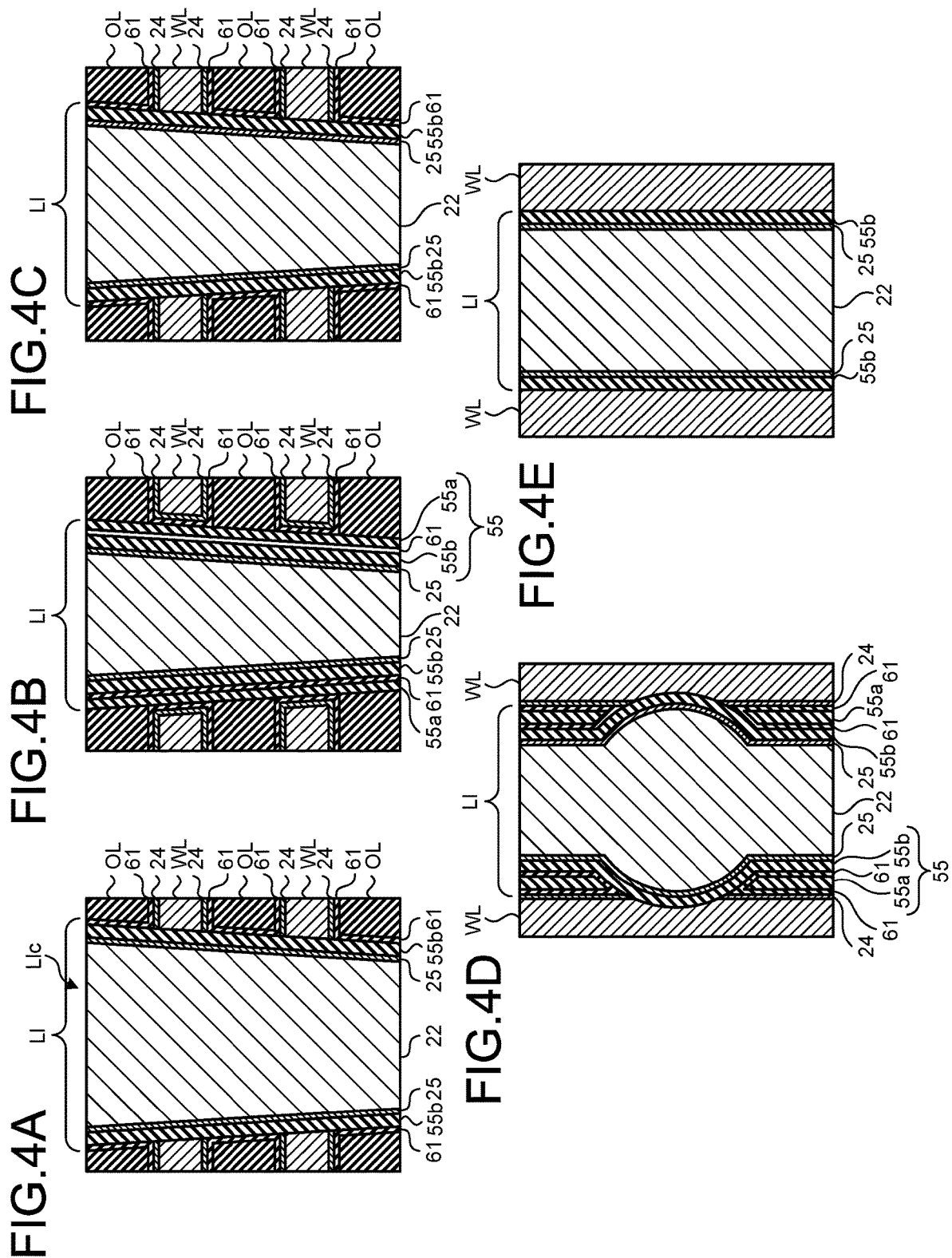

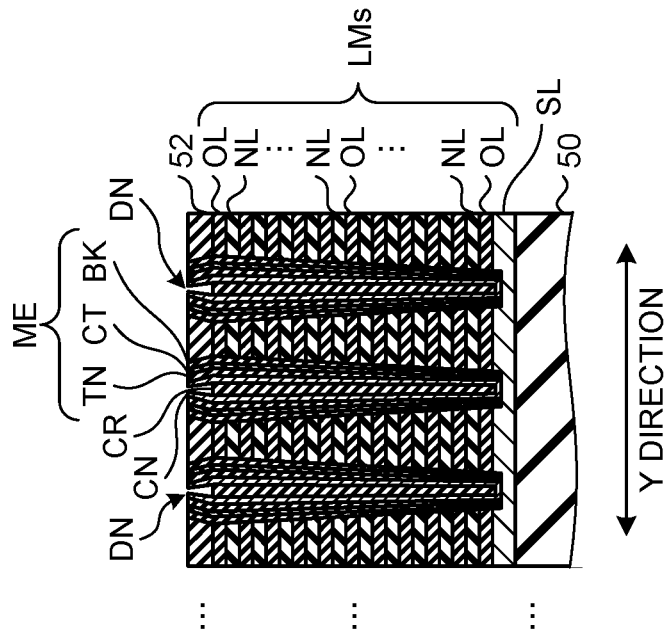
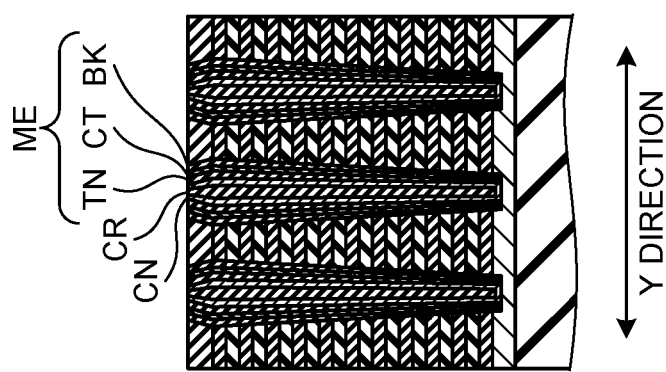
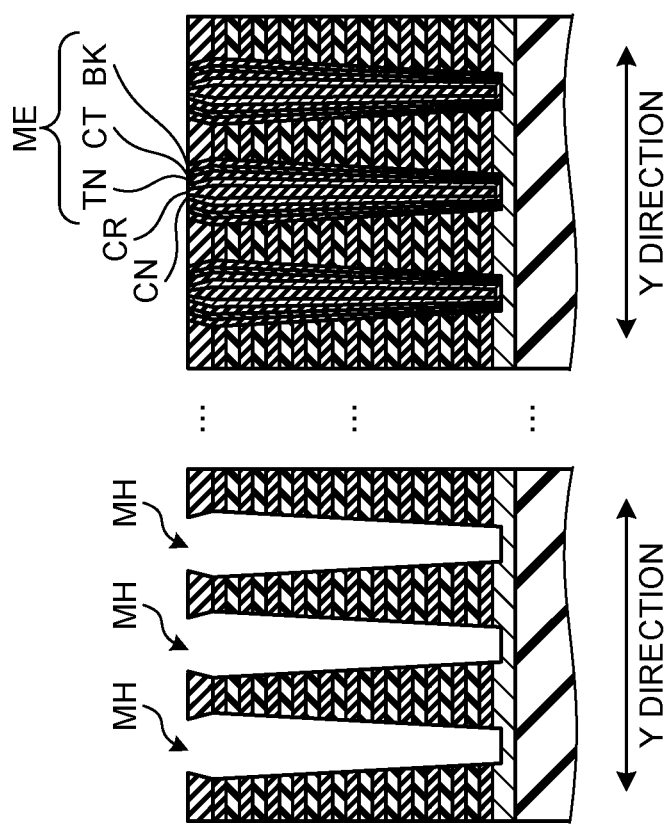

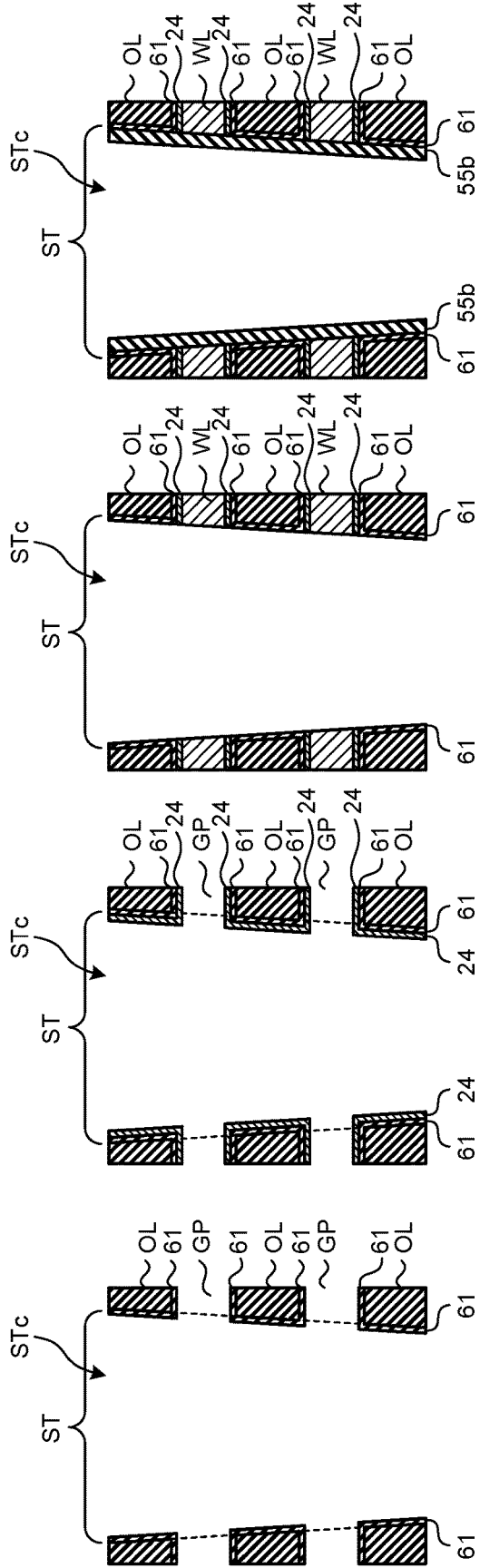

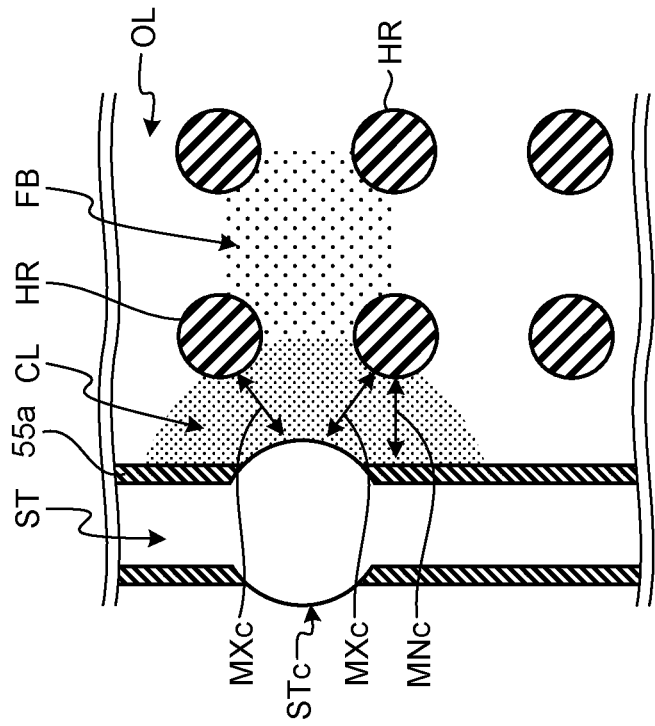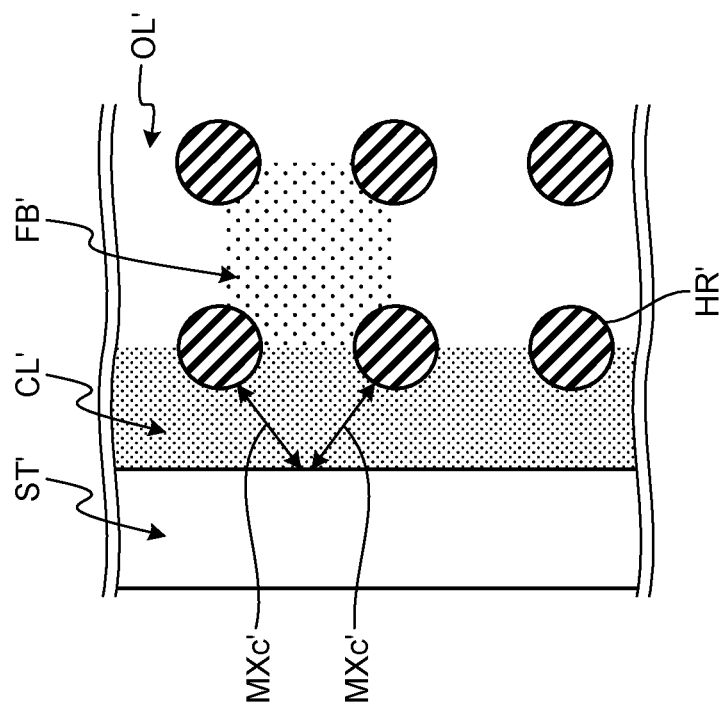

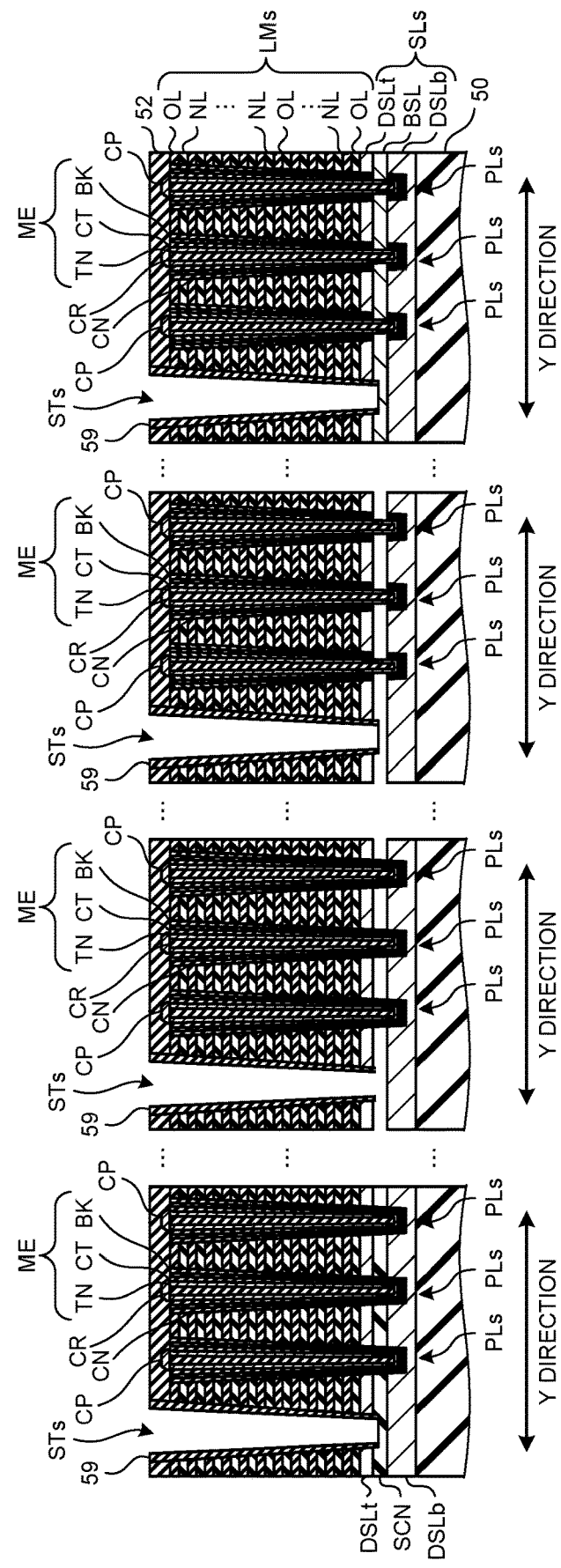

SEMICONDUCTOR MEMORY DEVICE

CROSS-REFERENCE TO RELATED APPLICATIONS

This application is based upon and claims the benefit of priority from Japanese Patent Application No. 2021-098827, filed on Jun. 14, 2021; the entire contents of which are incorporated herein by reference.

FIELD

Embodiments described herein relate generally to a semiconductor memory device.

BACKGROUND

In an exemplary manufacturing process of a semiconductor memory device such as a three-dimensional nonvolatile memory, a stacked body of conductive layers is formed by replacing a plurality of insulating layers with conductive layers. When replacing with the conductive layers, the stacked body becomes fragile due to removal of the plurality of insulating layers.

BRIEF DESCRIPTION OF THE DRAWINGS

FIGS. 4A to 4E are diagrams illustrating an exemplary layer structure of a plate-like contact provided to the semiconductor memory device according to the embodiment;

FIGS. 7A to 7C are diagrams illustrating exemplary procedures of the method for manufacturing the semiconductor memory device according to the embodiment;

FIGS. 14Aa to 14Bd are diagrams illustrating exemplary procedures of the method for manufacturing the semiconductor memory device according to the embodiment;

FIGS. 15A and 15B are schematic diagrams illustrating appearances of the semiconductor memory device according to the embodiment and a comparative example, during replacement;

FIGS. 19A to 19D are diagrams illustrating exemplary procedures of a method for manufacturing a semiconductor memory device according to another modified example of the embodiment.

DETAILED DESCRIPTION

Figure 1A:
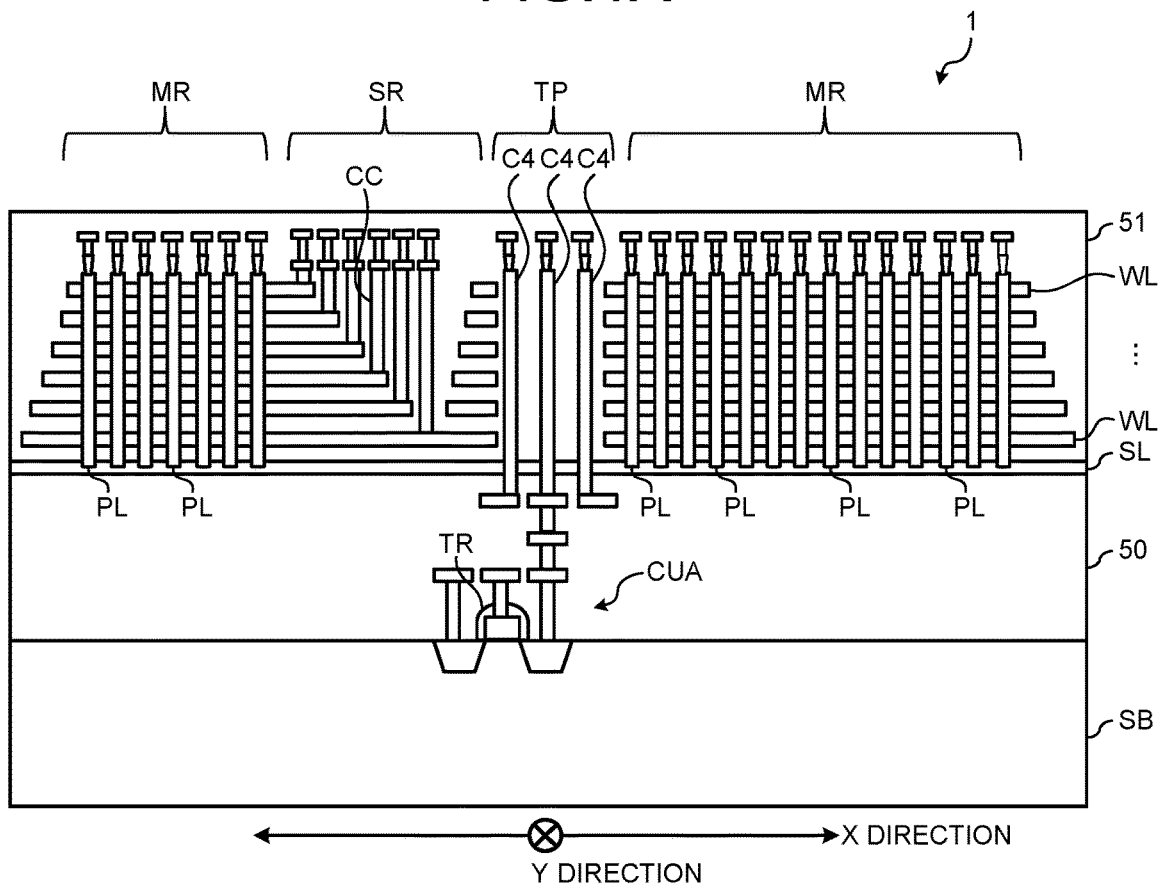
FIGS. 1A and 1B are diagrams illustrating an exemplary schematic structure of a semiconductor memory device according to an embodiment.

A semiconductor memory device of an embodiment includes: a first conductive layer; a stacked body including a plurality of second conductive layers and a plurality of first insulating layers alternately stacked one by one above the first conductive layer, and including a stepped portion in which the plurality of second conductive layers is terraced; a plurality of first pillars arranged in a memory region that is away from the stepped portion in a first direction that crosses a stacking direction of the stacked body, each first pillar including a semiconductor layer that penetrates the stacked body and connects with the first conductive layer, and forming a memory cell at an intersection with at least a part of the plurality of second conductive layers; and a plate-like portion including a third conductive layer that extends in the stacked body from the stepped portion to the memory region continuously in the stacking direction and in the first direction, the plate-like portion dividing the stacked body in a second direction that crosses both the stacking direction and the first direction, wherein the plate-like portion includes, in the stepped portion, a plurality of contact portions that is arranged intermittently in the first direction, the plurality of contact portions penetrating the stacked body and connecting with the first conductive layer.

Hereinafter, the present invention will be detailed referring to the drawings. Note that the present invention is not limited by the following embodiments. Also note that constituents in the following embodiments include those that would be easily conceived by a person skilled in the art, or any constituents that are substantially the same.

(Exemplary Structure of Semiconductor Memory Device)

Figure 1B:
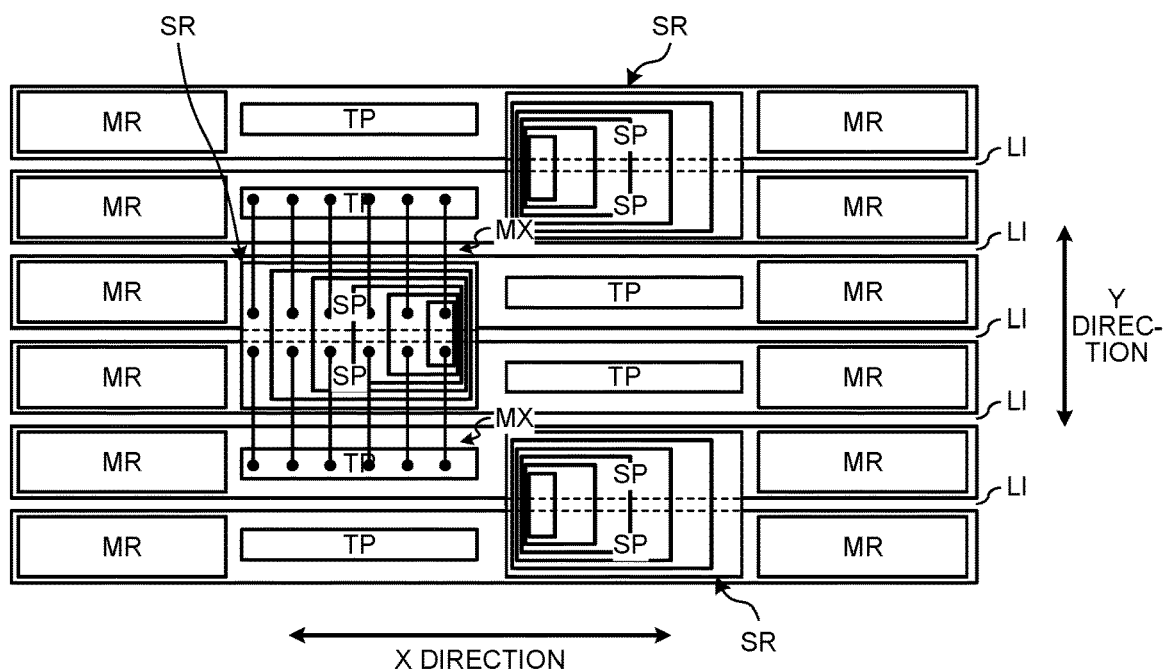

FIGS. 1A and 1B are diagrams illustrating a schematic exemplary structure of a semiconductor memory device 1 according to an embodiment. FIG. 1A is a cross-sectional view of the semiconductor memory device 1 taken along the X direction, and FIG. 1B is a schematic plan view illustrating a layout of the semiconductor memory device 1. FIG. 1A is presented without hatching for better visibility. FIG. 1A is also presented without a part of upper interconnects.

In the present specification, both the X direction and the Y direction are laid along a face of a word line WL described later, where the X direction and the Y direction are orthogonal to each other. A direction the word line WL is electrically led may occasionally be referred to as a "first direction", which is laid along the X direction. Meanwhile, a direction that crosses the first direction may occasionally be referred to as a "second direction", which is laid along the Y direction. Note that the first direction and the second direction are not always necessarily orthogonal to each other, since the semiconductor memory device 1 may contain manufacturing variations.

As illustrated in FIGS. 1A and 1B, the semiconductor memory device 1 has, on a substrate SB, a peripheral circuit CUA, memory regions MR, through-contact regions TP, and stepped regions SR.

The substrate SB is typically a semiconductor substrate such as a silicon substrate. The substrate SB has, arranged thereon, a peripheral circuit CUA that contains a transistor TR, interconnects and so forth.

The peripheral circuit CUA contributes to an operation of a memory cell described later. The peripheral circuit CUA is covered with an insulating layer 50. On the insulating layer 50, a source line SL is arranged. Above the source line SL, a plurality of word lines WL is stacked. The plurality of word lines WL is covered with an insulating layer 51. The insulating layer 51 also extends to the periphery of the plurality of word lines WL.

The plurality of word lines WL is divided, in the Y direction, by a plurality of plate-like contacts LI that penetrates the word lines WL in these stacking direction, and extends in a direction along the X direction.

Between every adjacent plate-like contacts LI, the plurality of memory regions MR is arranged, meanwhile between the plurality of memory regions MR, the stepped region SR and the through-contact region TP are arranged side by side, individually in the X direction. That is, each of the plurality of memory regions MR is arranged a predetermined distance away from the stepped region SR and from each through-contact region TP in the X direction.

In the memory region MR, a plurality of pillars PL, each penetrates the word lines WL in these stacking direction, is arranged. A plurality of memory cells is formed at intersections of the pillars PL and the word lines WL. As a consequence, the semiconductor memory device 1 is typically built as a three-dimensional nonvolatile memory in which memory cells are three-dimensionally arranged in each memory region MR.

Each stepped region SR contains a plurality of stepped portions SP individually formed of the plurality of word lines WL terraced downwards in the stacking direction, so as to give a bowl-like profile. In one stepped region SR, two stepped portions SP are arranged in the Y direction while placing one plate-like contact LI in between.

Each stepped portion SP forms one side of the bowl-like profile that is terraced down towards the bottom, from both sides in the X direction and from one side in the Y direction. The stepped portion SP on the other side in the Y direction is opened toward the side face of the plate-like contact LI.

Each stair of the stepped portion SP is formed of the word line WL of each hierarchy. The word lines WL of the individual hierarchies establish electrical conduction on both sides in the X direction while placing the stepped region SR in between, through the step portion on one side in the Y direction of the stepped portion SP. A contact CC that connects the word line WL of each hierarchy and the upper interconnect MX is arranged in the terrace portion of each stair of the stepped portion SP.

This enables leading-out of the individual word lines WL that are stacked in multiple layers. That is, write voltage, read voltage, and so forth are applied through these contacts CC to the memory cells in the memory regions MR that are arranged on both sides in the X direction, by way of the word lines WL which is laid at the same level of height with the memory cells.

Note now that the upward direction in the context of the present specification is specified by the direction that terrace faces of the individual stairs of the stepped portion SP are directed.

On one side in the X direction of the stepped region SR, there is arranged the through-contact region TP having no word line WL. In the through-contact region TP, there are arranged through-contacts C4 that connect the peripheral circuit CUA arranged on the lower substrate SB, with the upper interconnect MX connected to the contacts CC in the stepped portion SP. Various types of voltage applied through the contacts CC to the memory cells are controlled by the peripheral circuit CUA, through the through-contacts C4, the upper interconnect MX, and so forth.

Next, a detailed exemplary structure of the semiconductor memory device 1 will be described with reference to FIGS. 2A to 3B.

Figure 2A:
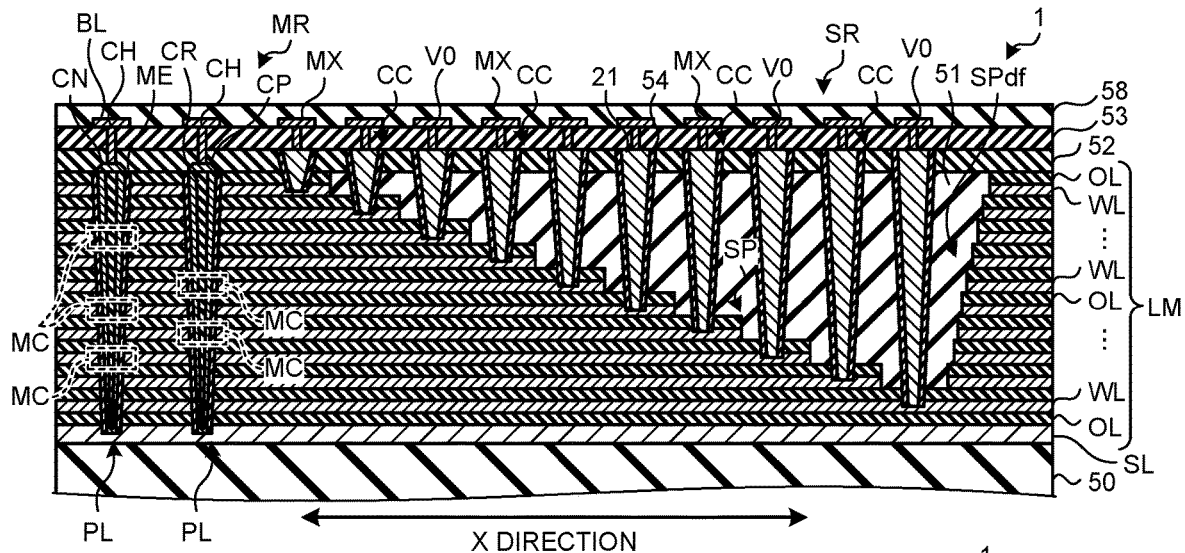
FIGS. 2A to 2C are cross-sectional views of the semiconductor memory device according to the embodiment.
Figure 2B:
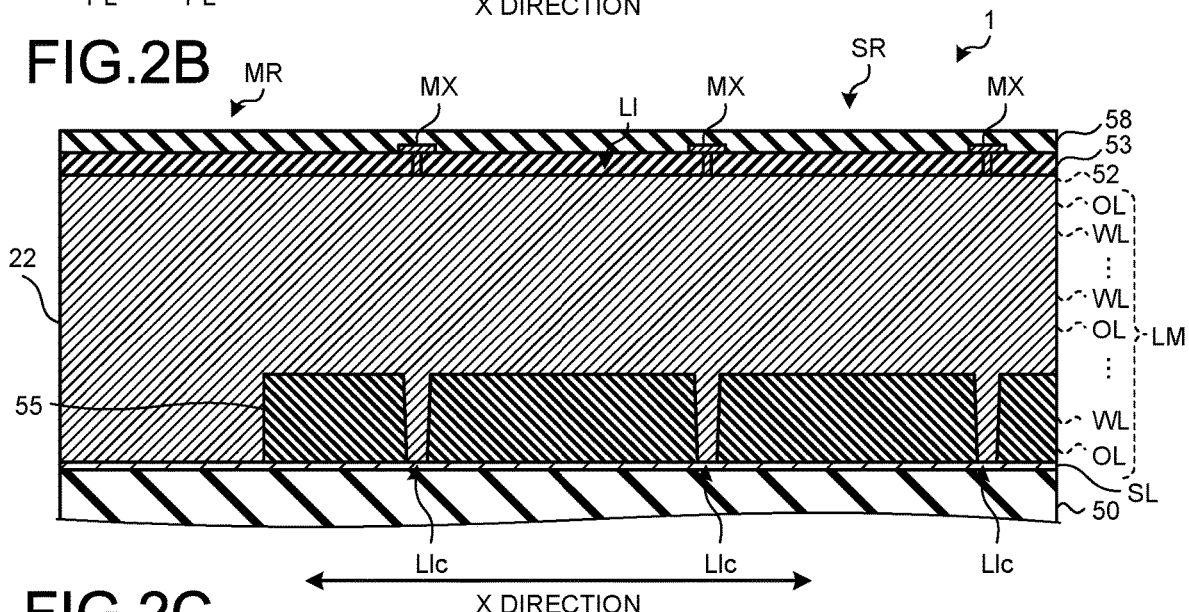
Figure 2C:
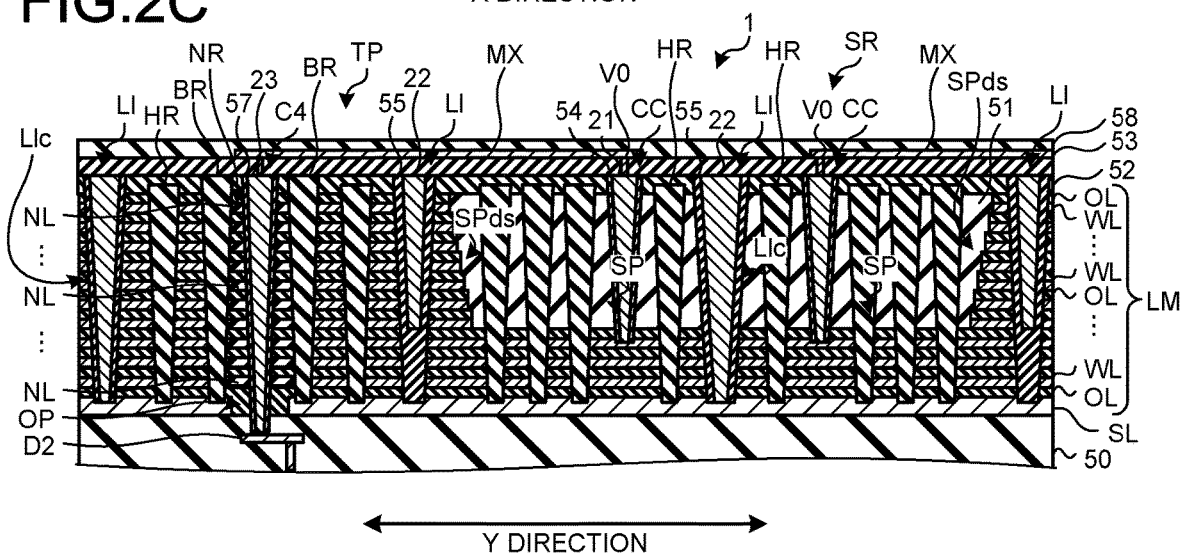

FIGS. 2A to 2C are cross-sectional views of the semiconductor memory device 1 according to the embodiment. FIG. 2A is a cross-sectional view taken along the X direction, including the memory region MR and the stepped region SR. FIG. 2B is a cross-sectional view taken along the X direction of the plate-like contact LI that extends along the memory region MR and across the stepped region SR. FIG. 2C is a cross-sectional view taken along the Y direction, including the stepped region SR and the through-contact region TP. Note that FIGS. 2A to 2C do not illustrate the substrate SB, a structure such as the peripheral circuit CUA in a lower part of the insulating layer 50, and so forth.

Figure 3A:
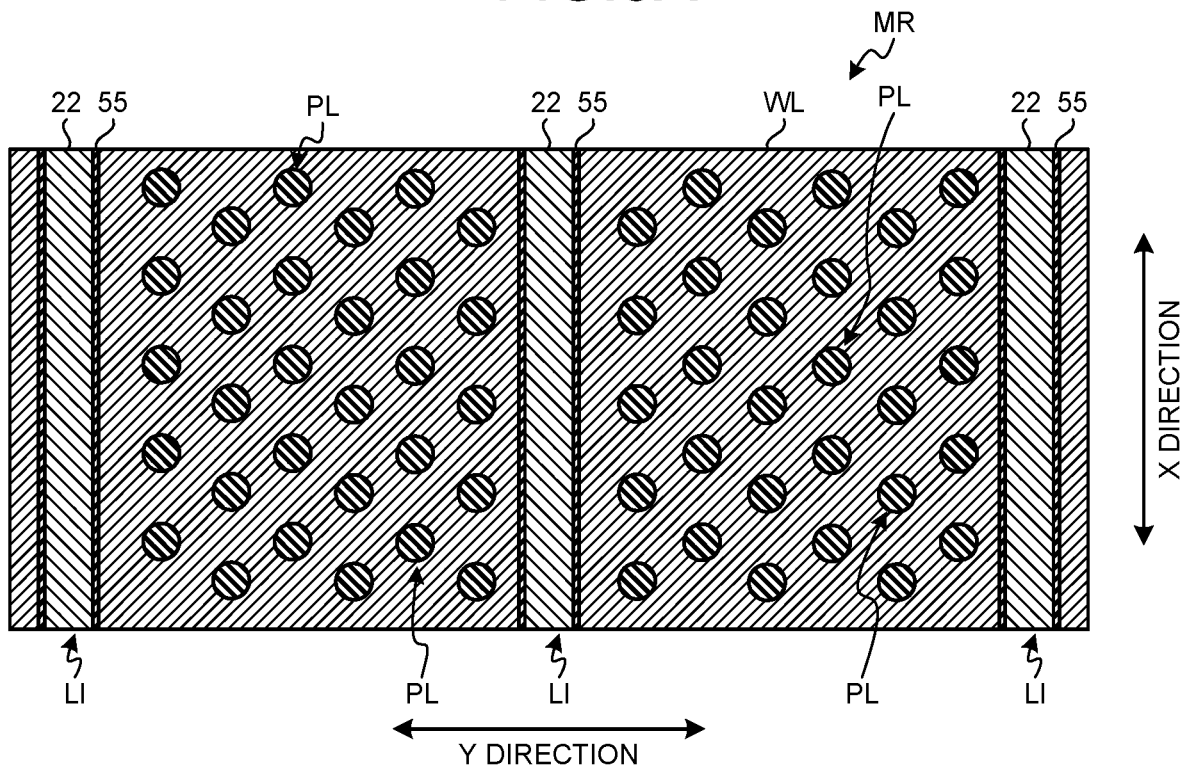
FIGS. 3A and 3B are transverse cross-sectional views of the semiconductor memory device according to the embodiment.
Figure 3B:
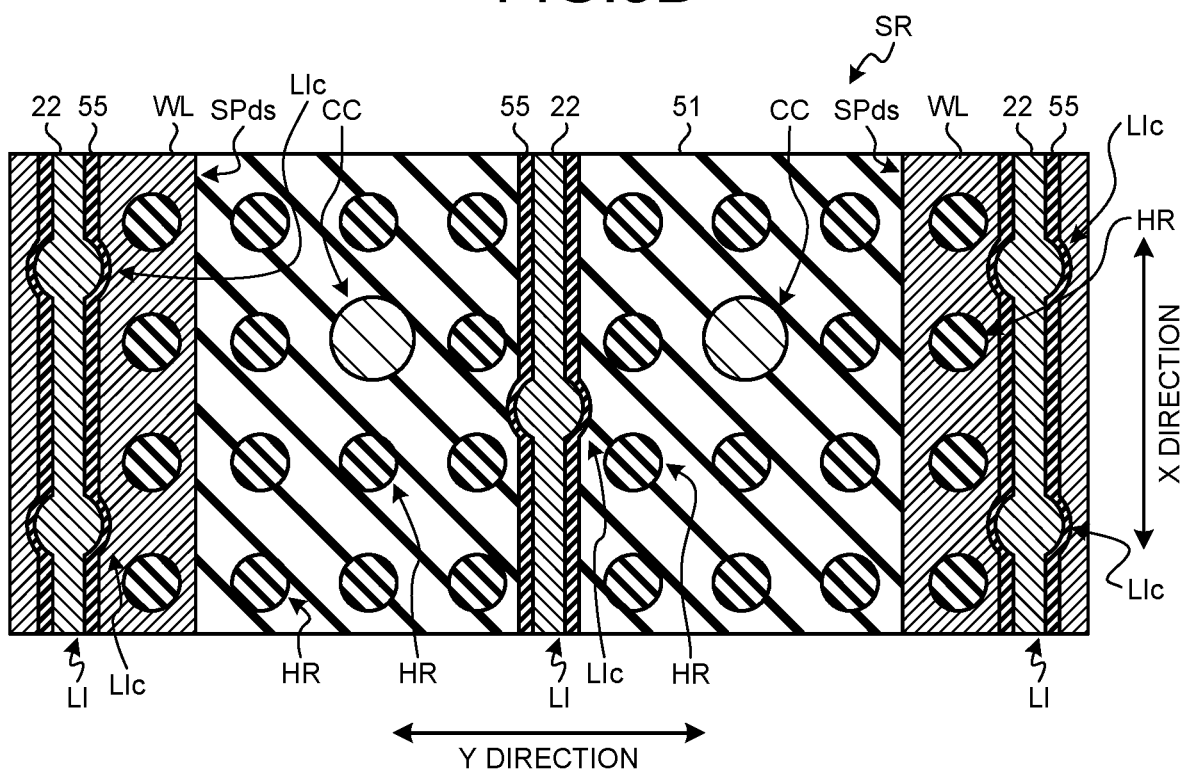

FIGS. 3A and 3B are transverse cross-sectional views of the semiconductor memory device 1 according to the embodiment. More specifically, FIGS. 3A and 3B are transverse cross-sectional views taken at a level of height of a freely selected word line WL, from among the plurality of word lines WL provided to the semiconductor memory device 1. FIG. 3A is a transverse cross-sectional view of the memory region MR, and FIG. 3B is a transverse cross-sectional view of the stepped region SR.

As illustrated in FIGS. 2A and 2C, a stacked body LM is arranged on the source line SL. The stacked body LM is built so as to alternately stack the plurality of word lines WL and a plurality of insulating layers OL one by one.

The source line SL that represents the first conductive layer is typically a conductive polysilicon layer. The word line WL that represents the second conductive layer is typically a tungsten layer or a molybdenum layer. The number of the stacked word lines WL in the stacked body LM is freely selectable. The insulating layer OL that represents the first insulating layer is typically a silicon oxide layer.

Note that one or more select gate lines, which represents the second conductive layer, may be stacked further on the uppermost word line. In addition, one or more select gate lines, which represents a second conductive layer, may be stacked further below the lowermost word line.

The top face of the stacked body LM is covered with an insulating layer 52. An insulating layer 53 is arranged on the insulating layer 52. An insulating layer 58 is arranged on the insulating layer 53.

As illustrated in FIGS. 2C, 3A, and 3B, the stacked body LM is divided in the Y direction by the plurality of plate-like contacts LI.

Each of the plate-like contacts LI which represent the plurality of plate-like portions, is juxtaposed in the Y direction, and extends in the stacking direction of the stacked body LM and in a direction along the X direction. That is, each plate-like contact LI penetrates the insulating layer 52 and the stacked body LM, to reach the source line SL. Each plate-like contact LI also continuously extends in the stacked body LM, over a range from the stepped region SR where the stepped portions SP are arranged to the memory regions MR.

As illustrated in FIGS. 2B, 3A, and 3B, each plate-like contact LI has an insulating layer 55 and a conductive layer 22. The insulating layer 55 covers the plate-like contact LI on the sidewalls thereof opposed in the Y direction. The conductive layer 22 extends inside the insulating layer 55 over a range from the stepped region SR to the memory region MR continuously. The plate-like contact LI also has a plurality of contact portions LIc.

The plurality of contact portions LIc constitutes a part of the conductive layer 22, and is intermittently arranged in the X direction in the stepped region SR. Each of the plurality of contact portions LIc penetrates the stacked body LM to connect with the source line SL.

The contact portion LIc typically has a circular, elliptic, or oval cross section along the direction the layers of the stacked body LM spread. Although the contact portion LIc may have a rectangular or other polygonal cross section, the contact portion LIc preferably has a rounded sidewall without apex, from the viewpoint of electrical characteristics at the contact portion LIc.

As illustrated in FIG. 3B, the contact portion LIc with the thus shaped cross section has the width in the Y direction, which is larger than the width of the plate-like contact LI in the Y direction, other than the contact portion LIc, in the stepped region SR. Hence, both end portions in the Y direction of the contact portion LIc swell out from both sidewalls of the plate-like contact LI which is narrower than the contact portion LIc.

In the neighboring plate-like contacts LI that represent the first and second plate-like portions, the contact portions LIc that represent the plurality of first contact portions contained in one plate-like contact LI, and the contact portions LIc that represent the plurality of second contact portions contained in the other plate-like contact LI, are arranged while being shifted from the opposing positions in the Y direction. That is, one contact portion LIc of one plate-like contact LI is typically arranged in the X direction, at a position between the two contact portions LIc of the other plate-like contact LI.

The distance between the neighboring ones of the plurality of contact portions LIc contained in the plate-like contacts LI preferably measures a half or shorter than the distance between the neighboring plate-like contacts LI.

The insulating layer 55 is typically a silicon oxide layer, and has a sidewall insulating layer portion that continuously covers the sidewall of the plate-like contact LI, over a range from the stepped region SR to the memory region MR.

The insulating layer 55 also has a first portion whose thickness, in the direction the layers of the stacked body LM spread, is intermittently increased in the X direction, than in the other portion of the plate-like contact LI in the stepped region SR. The first portion of the insulating layer 55 corresponds to a part of the sidewall insulating layer that intermittently covers the sidewall of the plate-like contact LI, in the stepped region SR other than the contact portion LIc. In other words, the insulating layer 55 has, at the contact portion LIc, a second portion whose thickness, in the direction the layers of the stacked body LM spread, is decreased than in the other portion of the plate-like contact LI.

Over the sidewalls of the plate-like contact LI which are opposed in the Y direction, the insulating layer 55 has an almost constant thickness in the Y direction over the entire range of the stepped region SR excluding the contact portion LIc. The thickness in the Y direction of the insulating layer 55 in the memory region MR is thinner than the first portion of the insulating layer 55 having an almost constant thickness in the stepped region SR, and is almost constant over the entire range of the memory region MR.

As illustrated in FIGS. 2B and 2C, the insulating layer 55 is also arranged in the lower portion of the plate-like contact LI in the stepped region SR, but excluding an area where the plurality of contact portions LIc is arranged. That is, in the stepped region SR, the plate-like contact LI contains, in the lower portion thereof, the insulating layer 55 that is divided in the X direction by the plurality of contact portions LIc, as the second insulating layer. The level of height of the insulating layer 55 that is arranged in the lower portion of the plate-like contact LI preferably measures, for example, a half or lower than the level of height of the top face of the stacked body LM.

Note that, in the memory region MR, the insulating layer 55 is not arranged in the lower portion of the plate-like contact LI.

The conductive layer 22 that represents the third conductive layer is typically a tungsten layer. As described previously, the conductive layer 22 extends in the stacking direction of the stacked body LM and in a direction along the X direction, and extends in the stacked body LM over a range from the stepped region SR to the memory region MR continuously. In the stepped region SR, the conductive layer 22 extends in a direction along the X direction so as to divide a part of the plurality of word lines WL in the Y direction, at an upper position in the plate-like contact LI, meanwhile in the memory region MR, extends in a direction along the X direction in the stacked body LM, over the entire range of the stacking direction of the stacked body LM.

Hence, the conductive layer 22 connects the plurality of contact portions LIc in the stepped region SR in the X direction. That is, in the stepped region SR, at least a part of the conductive layer 22 is connected to the source line SL through the contact portion LIc. Meanwhile in the memory region MR, the conductive layer 22 is connected to the source line SL in a direction along the X direction continuously. The conductive layer 22 is connected to the upper interconnect MX arranged in the insulating layer 58, through the plug V0 arranged in the insulating layer 53. With such structure, the plate-like contact LI can function as a source line contact.

Note that the plug V0 is preferably arranged above the contact portion LIc, so as to shorten the electrical path that is composed of the source line SL, the contact portion LIc, the conductive layer 22, the plug V0, and the upper interconnect MX.

As illustrated in FIGS. 3A and 3B, the width, in the Y direction, of the conductive layer 22 in the contact portion LIc is wider than the width, in the Y direction, of the conductive layer 22 in the plate-like contact LI other than the contact portion LIc in the stepped region SR. Meanwhile, the width in the Y direction of the conductive layer 22 in the memory region MR is almost constant, and is wider than the width in the Y direction of the conductive layer 22 other than the contact portion LIc in the stepped region SR.

Hence as described previously, the width in the Y direction of the plate-like contact LI, totaling the conductive layer 22 and the insulating layer 55, at the contact portion LIc is wider than the width in the Y direction of the plate-like contact LI, totaling the conductive layer 22 and the insulating layer 55, at a portion excluding the contact portion LIc in the stepped region SR. The width in the Y direction of the plate-like contact LI, totaling the conductive layer 22 and the insulating layer 55, in the memory region MR is nearly equal to the width in the Y direction of the plate-like contact LI at a portion excluding the contact portion LIc in the stepped region SR.

FIG. 2C illustrates cross sections of the plurality of plate-like contacts LI that includes, in the order from the right to the left in the drawing, a portion off the contact portion LIc, the contact portion LIc, a portion off the contact portion LIc, and the contact portion LIc.

As described previously, in the contact portion LIc, the plate-like contact LI has the insulating layer 55 that covers the sidewall of the plate-like contact LI over the entire range in the stacking direction of the stacked body LM, and the conductive layer 22 that penetrates the insulating layer 52 and the stacked body LM inside the insulating layer 55 to connect with the source line SL.

Meanwhile as seen in the cross section other than the contact portion LIc, the plate-like contact LI has the insulating layer 55 that covers the sidewall of the plate-like contact LI over the entire range in the stacking direction of the stacked body LM, as well as fills the lower portion of the plate-like contact LI, and the conductive layer 22 that is arranged on the insulating layer 55 inside the insulating layer 55, but is not connected to the source line SL.

As illustrated in FIGS. 2A and 3A, there is plurality of pillars PL arranged in the memory region MR.

The pillars PL that represent the plurality of first pillars are scatteringly arranged in the memory region MR, typically in a staggered manner when viewed in the stacking direction of the stacked body LM. Such staggered arrangement of the plurality of pillars PL can increase density of arrangement of the pillars PL per unit area of the word line WL in the stacked body LM. Each pillar PL typically has a circular, elliptic, or oval cross section along the direction the layers of the stacked body LM spread.

Each of the plurality of pillars PL has a memory layer ME that extends in the stacked body LM in the stacking direction, and a channel layer CN that penetrates the stacked body LM and connects with the source line SL. As described later, the memory layer ME has a multi-layered structure in which a block insulating layer, a charge storage layer, and a tunnel insulating layer are stacked in this order from the outer circumferential side of the pillar PL. The channel layer CN is arranged inside the memory layer ME and on the bottom face of the pillar PL. Further inside the channel layer CN, there is filled a core layer CR.

Each of the plurality of pillars PL has a cap layer CP at the top end. The cap layer CP is arranged in the insulating layer 52 so as to cover at least the top end of the channel layer CN, and is connected to the channel layer CN. The cap layer CP is connected through a plug CH that is arranged in the insulating layers 52 and 53, to a bit line BL arranged in the insulating layer 58.

The block insulating layer and the tunnel insulating layer composing the memory layer ME, and the core layer CN are typically silicon oxide layers. The charge storage layer composing the memory layer ME is typically a silicon nitride layer. Each of the channel layer CN and the cap layer CP is typically a semiconductor layer such as a polysilicon layer or an amorphous silicon layer.

With such structure, memory cells MC are formed at the individual portions where the side faces of the pillars PL are opposed to the individual word lines WL. Upon application of a predetermined voltage through the word line WL, it is performed reading to and writing to of data the memory cell MC.

In a case where a select gate line is arranged above or below the word line WL, a select gate is formed in a portion where the side face of the pillar PL faces the select gate line. Upon application of a predetermined voltage through the select gate line, the select gate turns on or off, so as to select or unselect the memory cell MC on the pillar PL, to which the select gate belongs.

As illustrated in FIGS. 2A and 2C, the stepped region SR has arranged therein the stepped portion SP, and dummy stepped portions SPdf and SPds. Each of the stepped portion SP, and the dummy stepped portions SPdf and SPds has a shape in which a plurality of word lines WL and a plurality of insulating layers OL are terraced.

The stepped portion SP extends in the X direction at a position close to the memory region MR, and terraced downwards in the direction away from the memory region MR. The dummy stepped portion SPdf extends in the X direction so as to face the stepped portion SP on the side away from the memory region MR, and terraced downwards and towards the stepped portion SP.

The dummy stepped portion SPds is arranged near the plate-like contact LI, on one side in the Y direction of the stepped portion SP and the dummy stepped portion SPdf. The dummy stepped portions SPds extends in the Y direction so as to face the plate-like contact LI on the other side neighboring in the Y direction, and terraced downwards and towards the plate-like contact LI on the other side.

Now, each of the dummy stepped portions SPdf and SPds has terrace portions on the individual stairs, which are shorter than the terrace portions in the stepped portion SP. Hence, each of the dummy stepped portions SPdf and SPds has a profile steeper than the stepped portion SP, having a step length defined as the length from the uppermost stair to the lowermost stair, shorter than in the stepped portion SP.

With the stepped portion SP, and the dummy stepped portions SPdf and SPds thus arranged, the stacked body LM has a recessed profile like a bowl in the stepped region SR. In this bowl-like region, there is the insulating layer 51 such as a silicon oxide layer, arranged so as to cover the top faces of the stepped portion SP, and the dummy stepped portions SPdf and SPds. The aforementioned insulating layers 52, 53, and 58 also cover the top face of the insulating layer 51.

FIG. 2C illustrates a cross section of the third stair from the lowermost stair in the stepped portion SP. As seen in FIG. 2C, there are stepped portions SP individually arranged on both sides in the Y direction of the plate-like contact LI that is illustrated at the center of the stepped region SR. On the opposite side in the Y direction of the plate-like contact LI in each stepped portion SP, there is arranged the dummy stepped portion SPds.

To the word line WL that composes each stair of the stepped portion SP, there is connected a contact CC that penetrates the insulating layers 52 and 51, and through the insulating layer OL that composes the terrace face of each stair. The contact CC has an insulating layer 54 that covers the outer circumference of the contact CC, and a conductive layer 21 such as a tungsten layer filled inside the insulating layer 54. The conductive layer 21 is connected to the upper interconnect MX arranged in the insulating layer 58, through the plug V0 arranged in the insulating layer 53. This structure enables electrical leading-out of the individual word lines WL in the individual stairs.

In the stepped portion SP and in the dummy stepped portions SPdf and SPds, there are arranged a plurality of columnar portions HR.

The columnar portions HR that represent the plurality of second pillars are scatteringly arranged in the stepped region SR while avoiding interference with the contacts CC, and are typically arranged in a grid pattern when viewed in the stacking direction of the stacked body LM. That is, the plurality of columnar portions HR is arranged at intersections that do not overlap the contacts CC when viewed in the stacking direction of the stacked body LM, from among intersections of an orthogonal grid such as a square grid and a rectangular grid.

A plurality of columnar portions HR that is lined up herein in the X direction neighboring the plate-like contact LI is preferably arranged, while being shifted from positions that are opposed in the Y direction to the contact portions LIc of the plate-like contacts LI. Each columnar portion HR typically has a circular, elliptic, or oval cross section along the direction the layers of the stacked body LM spread.

Each of the plurality of columnar portions HR is formed of an insulating layer such as a silicon oxide layer, which extends through the stacked body LM in the stacking direction to reach the source line SL, and does not contribute to any function of the semiconductor memory device 1. As described later, the columnar portions HR take part in supporting a structure created in the process of forming the stacked body LM, from a stacked body having sacrificial layers and insulating layers stacked therein.

As illustrated in FIGS. 3A and 3B, a pitch among the plurality of columnar portions HR is typically wider than a pitch among the plurality of pillars PL, and the density of arrangement of the columnar portions HR per unit area of the word line WL in the stacked body LM is lower than the density of arrangement of the pillars PL per unit area of the word line WL. In addition, a cross sectional area of the columnar portion HR when viewed in the stacking direction of the stacked body LM is typically larger than a cross sectional area of the pillar PL when viewed in the stacking direction of the stacked body LM.

With the pillars PL thus configured to have a small cross sectional area and a narrow pitch as compared with the columnar portions HR, for example, it now becomes possible to form a large number of memory cells MC more densely in a given size of the stacked body LM, and to increase storage capacity of the semiconductor memory device 1. On the other hand, the columnar portions HR are solely used to support the stacked body LM, so that rejection of a fine structure like the pillars PL, involving the small cross sectional area and the narrow pitch, can reduce manufacturing load.

The aforementioned dummy stepped portion may also be arranged at both end portions in the X direction, and at both end portions in the Y direction of the stacked body LM. Also these dummy stepped portions are covered with the insulating layer 51. The insulating layer 51 also extends to the periphery of the stacked body LM (see FIG. 1A). The plurality of columnar portions HR is also arranged in these dummy stepped portions.

As illustrated in FIG. 2C, the through-contact region TP includes an insulating region NR, and a plurality of columnar portions HR and block portions BR are arranged.

The insulating region NR has a structure in which a plurality of insulating layers NL and a plurality of insulating layers OL are alternately stacked one by one. The plurality of insulating layers NL is typically a silicon nitride layer, which is sacrificial layers remained unreplaced with the word lines WL, when the stacked body LM is formed from a stacked body having the sacrificial layers and the insulating layers OL stacked therein, as described later.

In the insulating region NR, a through-contact C4 is arranged. The through-contact C4 penetrates the insulating layer 52, and the insulating layers NL and OL of the insulating region NR, and passes through an opening OP provided in the source line SL, to reach the insulating layer 50 that covers the peripheral circuit CUA (see FIG. 1A). The through-contact C4 has an insulating layer 57 that covers the outer circumference of the through-contact C4, and a conductive layer 23 such as a tungsten layer filled inside the insulating layer 57.

The conductive layer 23 is connected to the upper interconnect MX arranged in the insulating layer 58, through the plug V0 arranged in the insulating layer 53. The upper interconnect MX is connected to the contact CC in the stepped portion SP. The conductive layer 23 is also connected to the peripheral circuit CUA, through a lower interconnect D2 arranged in the insulating layer 50.

Upon application of a predetermined voltage in this structure, from the peripheral circuit CUA to the memory cell MC through the through-contact C4, the contact CC, the word line WL and so forth, the memory cell MC can operate as a storage element. Since having the insulating layer 57, and being arranged in the insulating region NR in which the insulating layers NL and OL are stacked, the through-contact C4 is typically prevented from short-circuiting with the word line WL and so forth.

On both sides in the Y direction of the insulating region NR, the block portions BR are arranged. Each block portion BR is configured as a plate-like insulating member that extends in the X direction along the side face along the X direction of the insulating region NR, and penetrates the insulating layer 52 and the stacked body LM, to reach the source line SL. The block portion BR prevents the insulating layer NL in the insulating region NR from being replaced with the word line WL, when the stacked body LM is formed from a stacked body in which the sacrificial layers and the insulating layers OL are stacked, as described later.

(Layer Structure of Plate-Like Contact)

Next, an example of a more detailed layer structure of the plate-like contact LI contained in the semiconductor memory device 1 will be described with reference to FIGS. 4A to 4E. FIGS. 4A to 4E are diagrams illustrating an exemplary layer structure of the plate-like contact LI contained in the semiconductor memory device 1 according to the embodiment.

FIG. 4A is a cross-sectional view taken along the Y direction of the plate-like contact LI in the stepped region SR, illustrating a cross section of the contact portion LIc. FIG. 4B is a cross-sectional view taken along the Y direction of the plate-like contact LI in the stepped region SR, illustrating a cross section of a portion off the contact portion LIc. FIG. 4C is a cross-sectional view taken along the Y direction of the plate-like contact LI in the memory region MR.

FIG. 4D is a transverse cross-sectional view of the plate-like contact LI in the stepped region SR, illustrating a cross section at a level of height of a freely selected word line WL. FIG. 4E is a transverse cross-sectional view of the plate-like contact LI in the memory region MR, illustrating a cross section at a level of height of a freely selected word line WL.

As illustrated in FIG. 4D, in the stepped region SR, the insulating layer 55 has a portion along the contact portion LIc which is thinned over the sidewalls of the plate-like contact LI which are opposed in the Y direction than in the other portion, and a portion which is thickened than in the portion along the contact portion LIc.

More specifically, the insulating layer 55 has an insulating layers 55a and 55b, in which over the sidewalls of the plate-like contact LI where the insulating layer 55 is thickened, there are arranged the insulating layers 55a and 55b that represent the sidewall insulating layers, in this order from the sidewall side of the plate-like contact LI. On the other hand, over the sidewalls of the contact portion LIc where the insulating layer 55 is thinned, there is arranged only the insulating layer 55b, out of the insulating layers 55a and 55b.

As illustrated in FIGS. 4A and 4D, in the contact portion LIc, the block layer 61 is arranged on a face, opposed to the insulating layer OL, of the insulating layer 55b. Meanwhile in the contact portion LIc, the block layer 61 is not arranged on the face, opposed to the word line WL, of the insulating layer 55b.

The block layer 61 that represents the metal element-containing layer is formed of a metal oxide-containing layer such as an aluminum oxide ($Al_2O_3$) layer. The block layer 61, arranged on the face, opposed to the insulating layer OL, of the insulating layer 55b, further extends to a position between the insulating layer OL and the word line WL.

Between the block layer 61 and the word line WL, there is further arranged a barrier metal layer 24. That is, the block layer 61 and the barrier metal layer 24 are interposed in this order from the insulating layer OL side, between the insulating layer OL and the word line WL. The barrier metal layer 24, thus arranged on the top and back faces of the word line WL, can suppress a metal atom such as tungsten or molybdenum, composing the word line WL, from diffusing into the other neighboring layer. The barrier metal layer 24 typically includes at least one of titanium layer, titanium nitride layer, tantalum layer, or tantalum nitride layer.

A barrier metal layer 25 is similarly interposed between the conductive layer 22 and the insulating layer 55b at around the contact portion LIc. The barrier metal layer 25, thus arranged in contact with the conductive layer 22, can suppress a metal atom such as tungsten that composes the conductive layer 22 from diffusing into the other neighboring layer. Similarly to the barrier metal layer 24, the barrier metal layer 25 typically includes at least one of a titanium layer, a titanium nitride layer, a tantalum layer, and a tantalum nitride layer.

As illustrated in FIGS. 4B and 4D, in the portion where the insulating layer 55 is thickened, excluding the contact portion LIc, the insulating layer 55 has, at a predetermined position in the thickness direction, the block layer 61 that extends over the entire range of the stacked body LM in the stacking direction. More specifically, the block layer 61 is interposed at a position between the insulating layers 55a and 55b, and extends between the insulating layers 55a and 55b in the stacking direction of the stacked body LM.

The block layer 61 is also arranged on the face, opposed to the word line WL, of the insulating layer 55a, in the portion of the plate-like contact LI other than the contact portion LIc. Meanwhile the block layer 61 is not arranged on the face, opposed to the insulating layer OL, of the insulating layer 55a, in the portion other than the contact portion LIc.

The block layer 61 arranged on the face, opposed to the word line WL, of the insulating layer 55a further extends to a position between the word line WL and the insulating layer OL. That is, the block layer 61 covers the faces of each word line WL on both sides in the stacking direction of the stacked body LM, and the end face of each word line WL opposed to the plate-like contact LI.

Further inside the block layer 61, the barrier metal layer 24 is arranged. That is, the block layer 61 and the barrier metal layer 24 are interposed between the insulating layer OL and the word line WL, and between the insulating layer 55a and the word line WL, in this order from the insulating layer OL or from the insulating layer 55a. Similarly, a barrier metal layer 25 is interposed between the conductive layer 22 and the insulating layer 55b of the plate-like contact LI.

The block layer 61 interposed between the insulating layers 55a and 55b, and the block layer 61 arranged on the face, opposed to the word line WL, of the insulating layer 55a, are joined to each other at the end of the insulating layer 55a that terminates at the contact portion LIc that swells to both sides in the Y direction than the other portion of the plate-like contact LI. That is, at the level of height of the word line WL, the block layer 61 covers the circumference of the insulating layer 55a.

As illustrated in FIGS. 4C and 4E, in the memory region MR, the plate-like contact LI has the same layer structure as the contact portion LIc of the stepped region SR.

That is, in the memory region MR, the plate-like contact LI has the insulating layer 55b on the sidewalls opposed to each other in the Y direction. The block layer 61 is arranged on a face, opposed to the insulating layer OL, of the insulating layer 55b. The block layer 61 extends to a position between the insulating layer OL and the word line WL without being arranged on a face, opposed to the word line WL, of the insulating layer 55b.

Between the block layer 61 and the word line WL, the barrier metal layer 24 is arranged. Similarly, the barrier metal layer 25 is arranged between the insulating layer 55b and the conductive layer 22 of the plate-like contact LI.

(Method for Manufacturing Semiconductor Memory Device)

Next, a method for manufacturing the semiconductor memory device 1 according to the embodiment will be explained, referring to FIGS. 5A to 14Bd. FIGS. 5A to 14Bd are diagrams illustrating exemplary procedures of the method for manufacturing the semiconductor memory device 1 according to the embodiment. Note that the processes illustrated in FIGS. 5A to 14Bd are preceded by formation of the peripheral circuit CUA on the substrate SB, formation of the insulating layer 50 that covers the peripheral circuit CUA, and formation of the source line SL that covers the insulating layer 50.

First, appearances during formation of the stepped portion SP are illustrated in FIGS. 5A to 6B. FIGS. 5A to 6B illustrate cross sections, taken along the Y direction, of a region that is later processed into the stepped region SR.

Figure 5A:
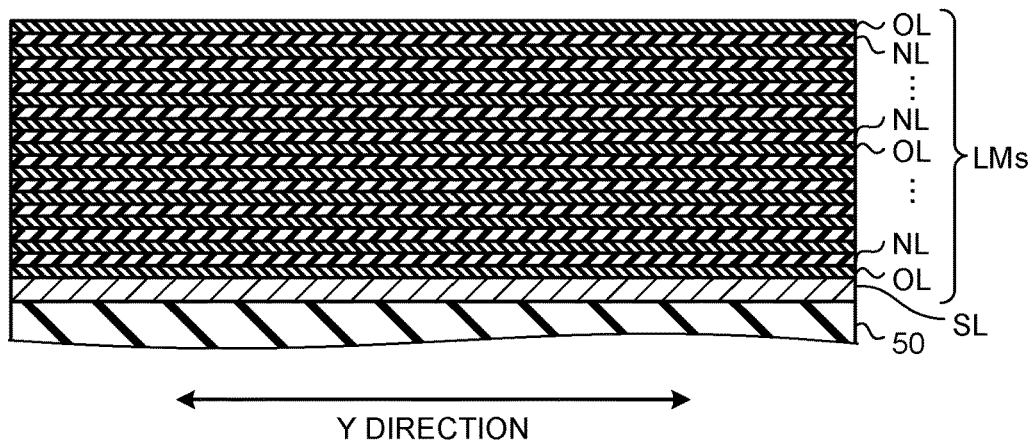
FIGS. 5A to 5C are diagrams illustrating exemplary procedures of a method for manufacturing the semiconductor memory device according to the embodiment.

As illustrated in FIG. 5A, a stacked body LMs, having a plurality of insulating layers NL and a plurality of insulating layers OL alternately stacked therein one by one, is formed on the source line SL. The insulating layer NL is typically a silicon nitride layer, and functions as a sacrificial layer that is later replaced with a conductive material and becomes the word line WL.

Figure 5B:
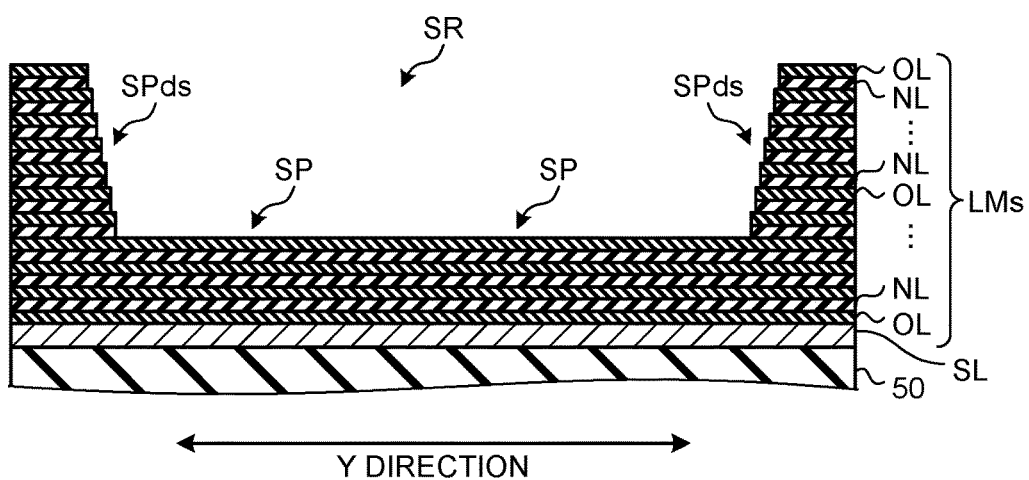

As illustrated in FIG. 5B, in a partial region of the stacked body LMs, the insulating layer NL and the insulating layer OL are terraced downwards to form the stepped portion SP. The stepped portion SP is formed by slimming the mask pattern such as a photoresist layer, and by etching the insulating layer NL and the insulating layer OL that compose the stacked body LMs, which are repeated multiple times.

That is, the mask pattern having an opening at a site of formation of the stepped portion SP is formed on the top face of the stacked body LMs, and the insulating layer NL and the insulating layer OL are typically etched off one by one. The opening edge of the mask pattern is then set back to widen the opening typically by oxygen plasma treatment, and the insulating layer NL and the insulating layer OL are again etched off one by one. By repeating such processes multiple times, the insulating layer NL and the insulating layer OL in the opening of the mask pattern are terraced downwards.

The mask pattern is newly re-formed after repeating the aforementioned processes a predetermined number of times, so that the mask pattern keeps the thickness not smaller than a predetermined level. In this process, by properly adjusting position of the opening of the mask pattern, the stepped portion SP with a relatively moderate slope, and the steep dummy stepped portions SPdf and SPds may be formed. Similarly, by adjusting the end positions of the mask pattern at both ends in the X direction and both ends in the Y direction of the stacked body LMs, steep dummy stepped portions are individually formed at the four ends of the stacked body LMs, similarly to the dummy stepped portions SPdf and SPds.

FIG. 5B is a cross-sectional view of the third stair of the thus formed stepped portion SP. The cross section illustrated in FIG. 5B will be divided into two stepped portions SP, by the plate-like contact LI formed later. The dummy stepped portion SPds is formed on one side in the Y direction of the stacked body LMs of each stepped portion SP.

Figure 5C:
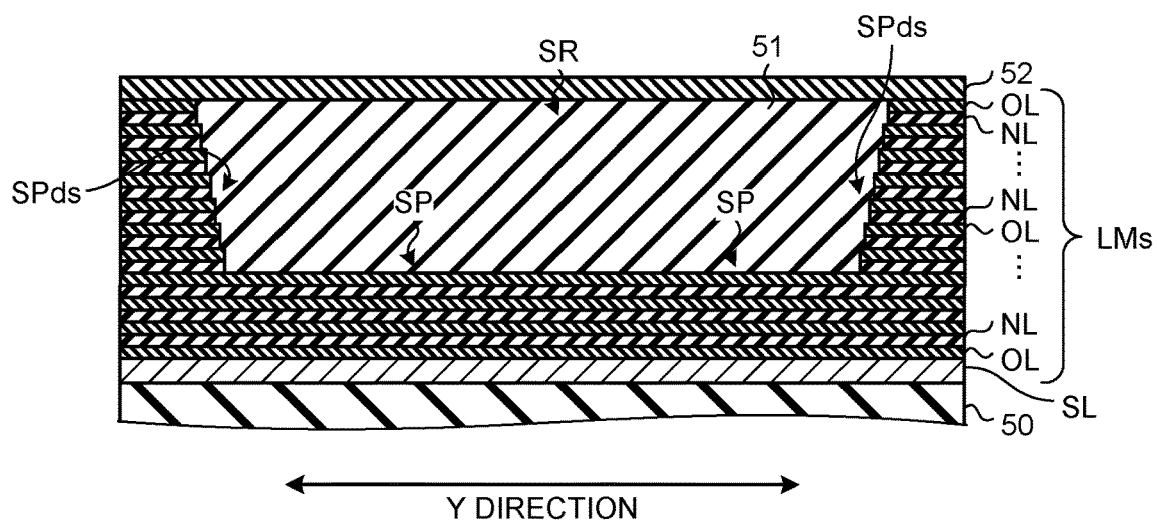

As illustrated in FIG. 5C, the insulating layer 51 such as a silicon oxide layer is formed so as to cover the stepped portion SP, and to reach the level of height of the top face of the stacked body LMs. That is, the insulating layer 51 is formed in a bowl-like region that is surrounded by the stepped portion SP and the dummy stepped portions SPds and SPdf. The insulating layer 51 is also formed around the stacked body LMs that has the dummy stepped portions at the end. The insulating layer 52 is further formed so as to cover the top face of the stacked body LMs, and the top face of the insulating layer 51 over the region of the bowl-like region that contains the stepped portion SP.

Figure 6A:
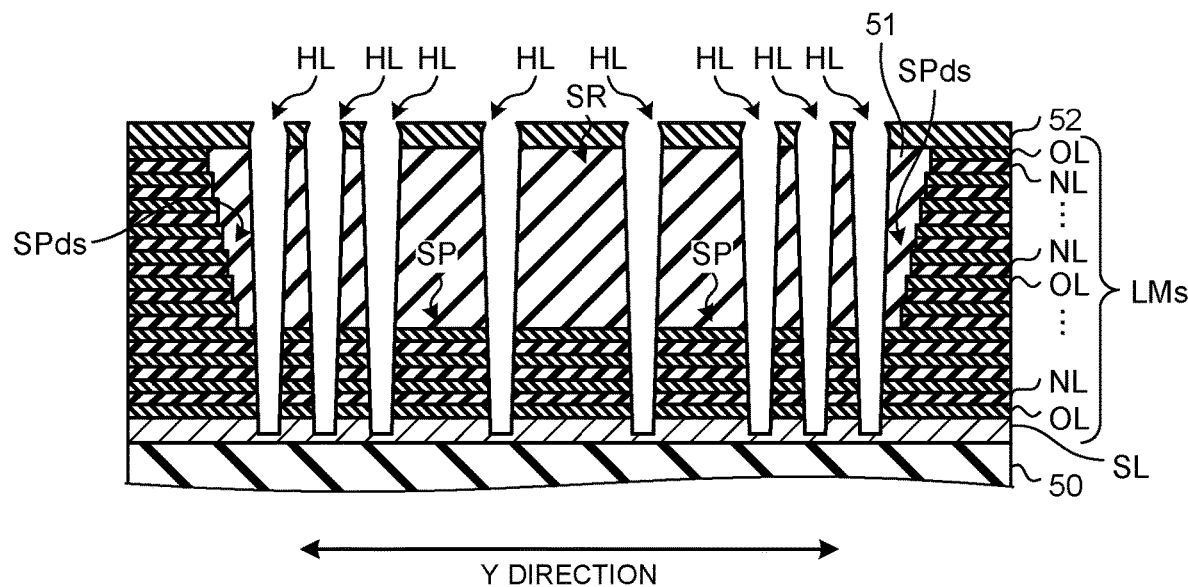
FIGS. 6A and 6B are diagrams illustrating exemplary procedures of the method for manufacturing the semiconductor memory device according to the embodiment.

As illustrated in FIG. 6A, a plurality of holes HL, which penetrates the insulating layers 52 and 51 and the stacked body LMs to reach the source line SL, is formed in a bowl-like region that is surrounded by the stepped portion SP and the dummy stepped portions SPds and SPdf.

Figure 6B:
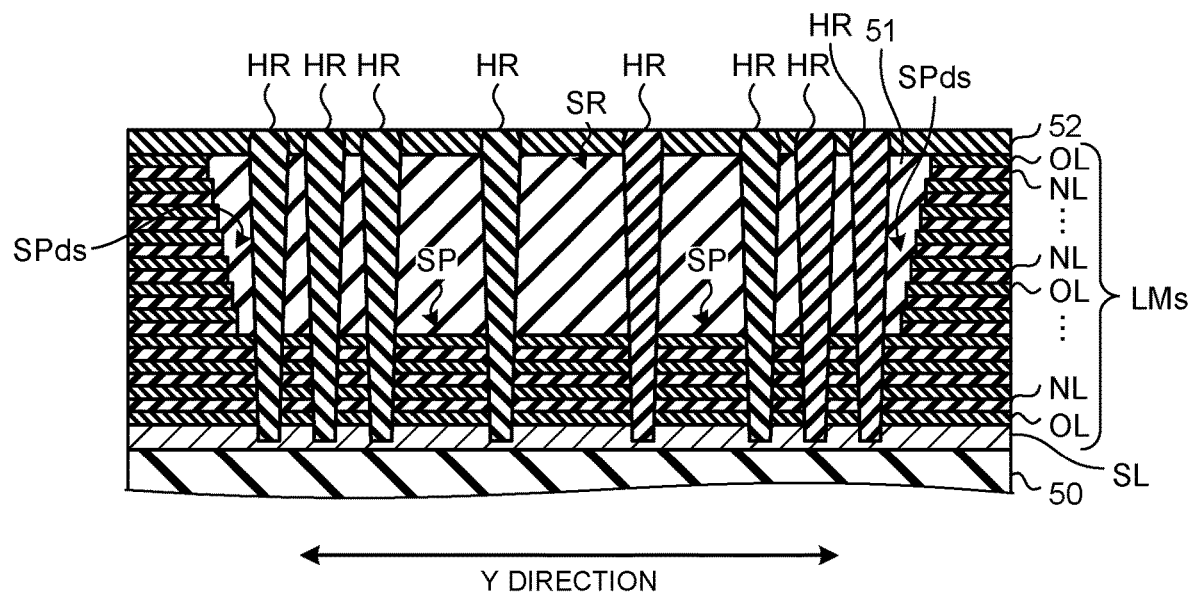

As illustrated in FIG. 6B, the hole HL is filled with an insulating layer such as a silicon oxide layer, whereby a plurality of columnar portions HR is formed. Parallelly in this process, a plurality of columnar portions HR is also formed in the dummy stepped portions at the end of the stacked body LMs.

Next, FIGS. 7A to 8C illustrate appearances during formation of the pillars PL. FIGS. 7A to 8C illustrate cross sections taken along the Y direction of a region that is later processed into the memory region MR. Note that, as described previously, each pillar PL, since typically having a circular, elliptic, or oval cross section, gives similar cross sectional shape, irrespective of directionality of the cross section.

As illustrated in FIG. 7A, also in the region where the memory region MR will be formed later, the stacked body LMs is formed on the source line SL, and the insulating layer 52 is formed on the stacked body LMs, as a result of the aforementioned processes. In this structure, a plurality of memory holes MH that penetrates the insulating layer 52 and the stacked body LMs to reach the source line SL is formed.

As illustrated in FIG. 7B, in each memory hole MH, there are formed a memory layer ME in which a block insulating layer BK, a charge storage layer CT, and a tunnel insulating layer TN are stacked in this order from the outer circumferential side of the memory hole MH. As described previously, the block insulating layer BK and the tunnel insulating layer TN are typically a silicon oxide layer, and the charge storage layer CT is typically a silicon nitride layer.

Further inside the tunnel insulating layer TN, there is formed a channel layer CN such as a polysilicon layer or an amorphous silicon layer. The channel layer CN is also formed on the bottom face of the memory hole MH. Further inside the channel layer CN, there is filled a core layer CR such as a silicon oxide layer.

As illustrated in FIG. 7C, the core layer CR exposed on the top face of the insulating layer 52 is etched off to a predetermined depth, to form a recess DN.

Figure 8A:
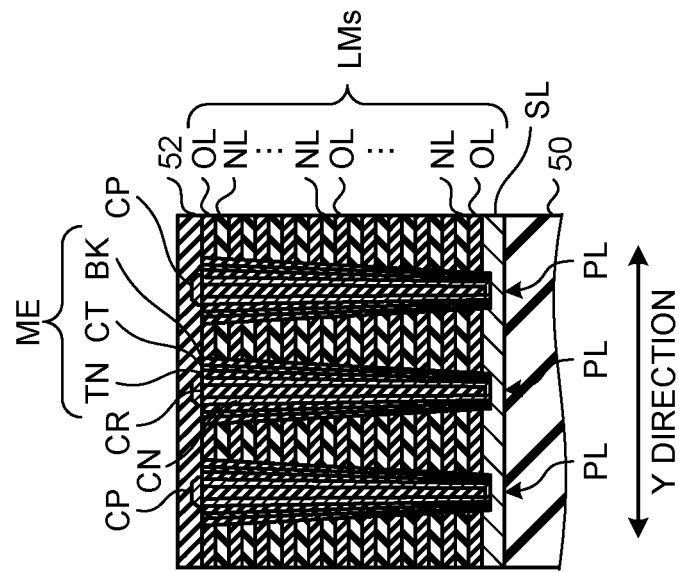
FIGS. 8A to 8C are diagrams illustrating exemplary procedures of the method for manufacturing the semiconductor memory device according to the embodiment.

As illustrated in FIG. 8A, the inside of the recess DN is filled typically with a polysilicon layer or an amorphous silicon layer, to form a cap layer CP. The plurality of pillars PL is thus formed.

Figure 8B:
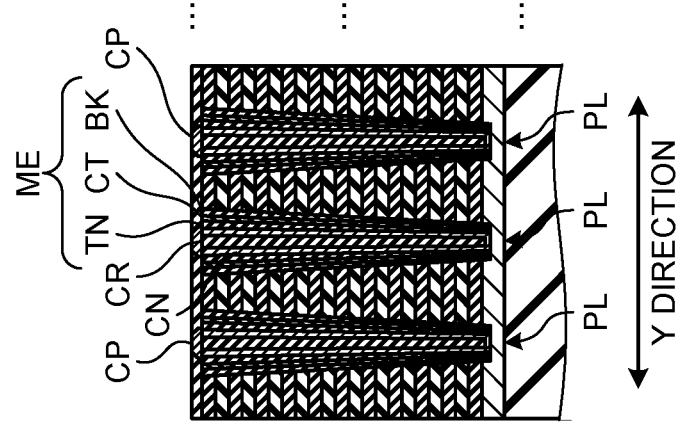

As illustrated in FIG. 8B, the insulating layer 52 is etched back together with the top face of the cap layer CP. The cap layer CP is thus thinned.

Figure 8C:
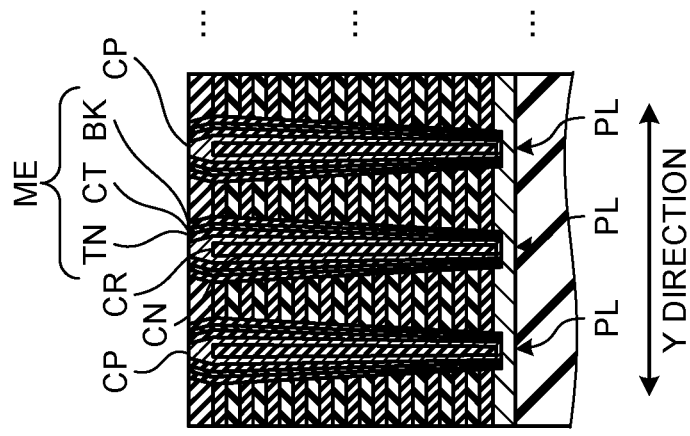

As illustrated in FIG. 8C, the insulating layer 52 having been thinned by etch-back is supplemented. The top face of the cap layer CP is thus covered with the insulating layer 52.

Note that the order of the process for forming the stepped portion SP in FIGS. 5B and 5C, the process for forming the columnar portions HR in FIGS. 6A and 6B, and the process for forming the pillars PL in FIGS. 7A to 8C are interchangeable with each other.

Next, FIGS. 9A to 10C illustrate appearances during formation of a slit ST that is later processed into the plate-like contact LI.

Figure 9A:
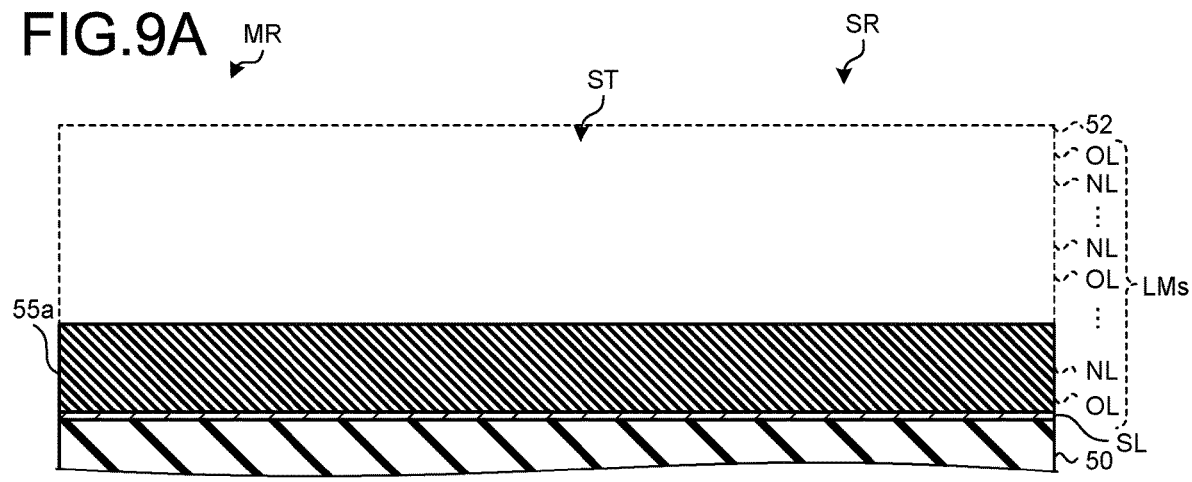
FIGS. 9A to 9C are diagrams illustrating exemplary procedures of the method for manufacturing the semiconductor memory device according to the embodiment.
Figure 10A:
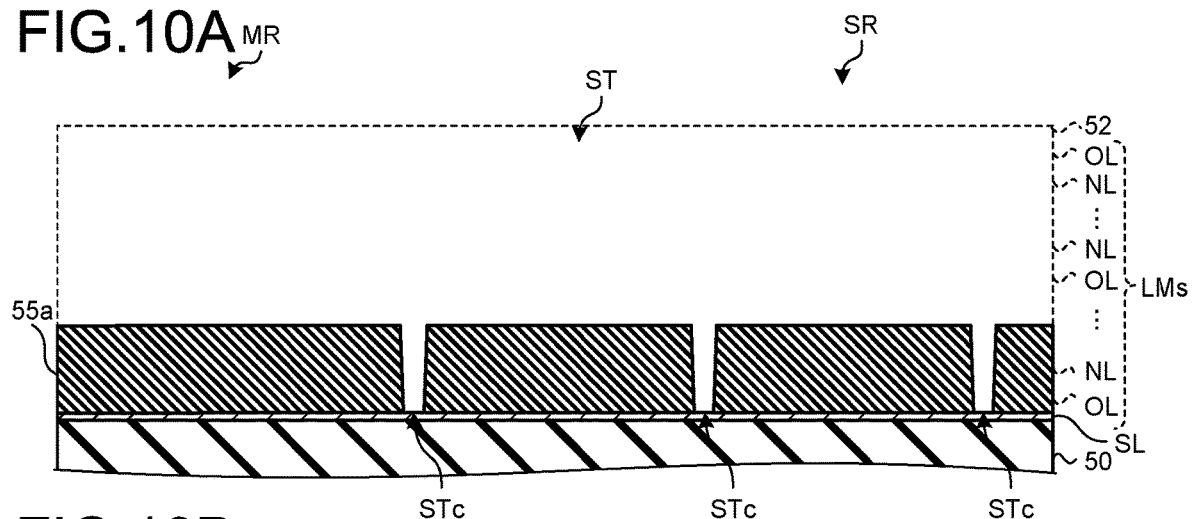
FIGS. 10A to 10C are diagrams illustrating exemplary procedures of the method for manufacturing the semiconductor memory device according to the embodiment.

FIGS. 9A and 10A illustrate cross sections taken along the X direction of the slit ST, corresponding to FIG. 2B.

Figure 9B:
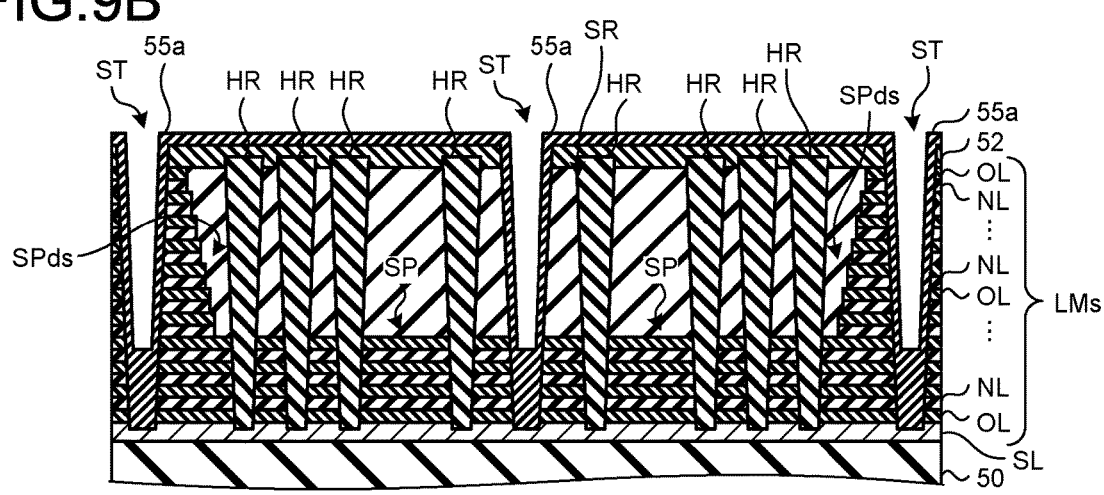
Figure 10B:
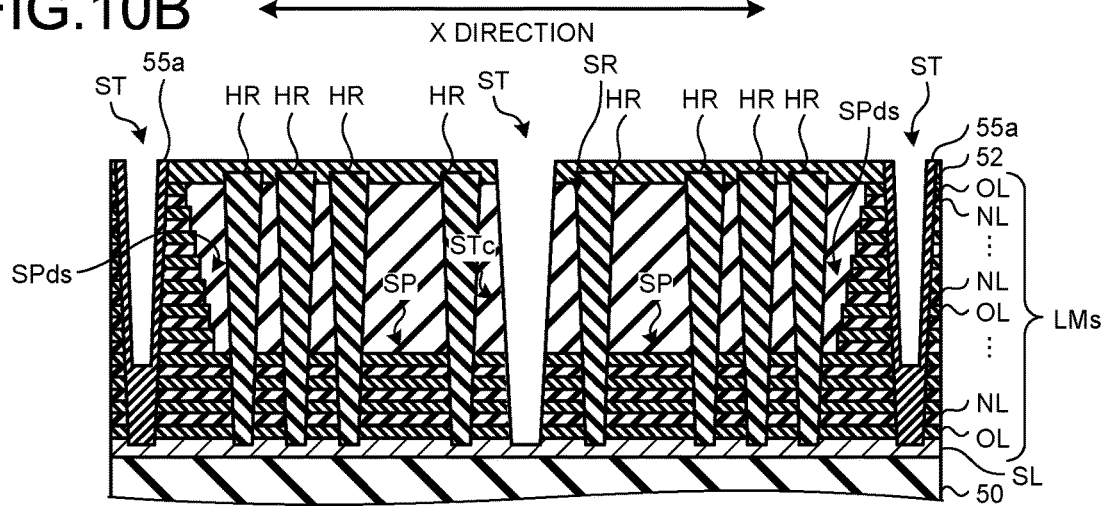

FIGS. 9B and 10B illustrate cross sections of the stepped region SR taken along the Y direction. Now, as illustrated in FIG. 9B, also in the stepped portion SP, the upper end portions of the columnar portions HR are etched back, the insulating layer 52 is supplemented, and the top face of the columnar portion HR is covered with the insulating layer 52, by the aforementioned processes illustrated in FIGS. 7A to 8C.

Figure 9C:
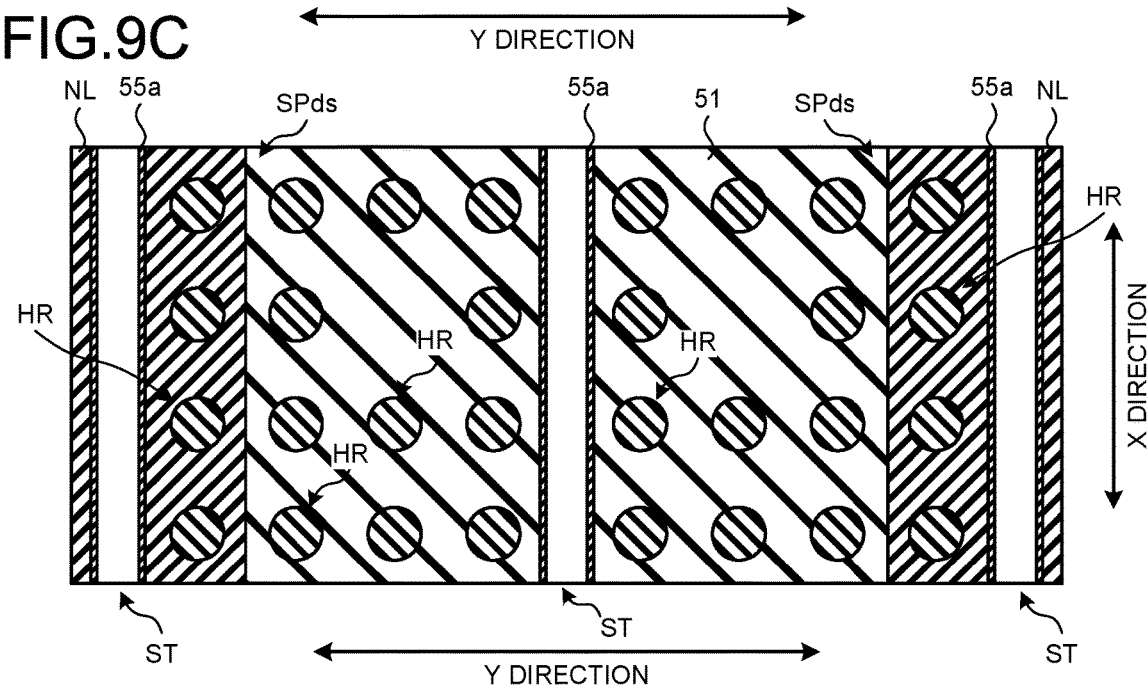
Figure 10C:
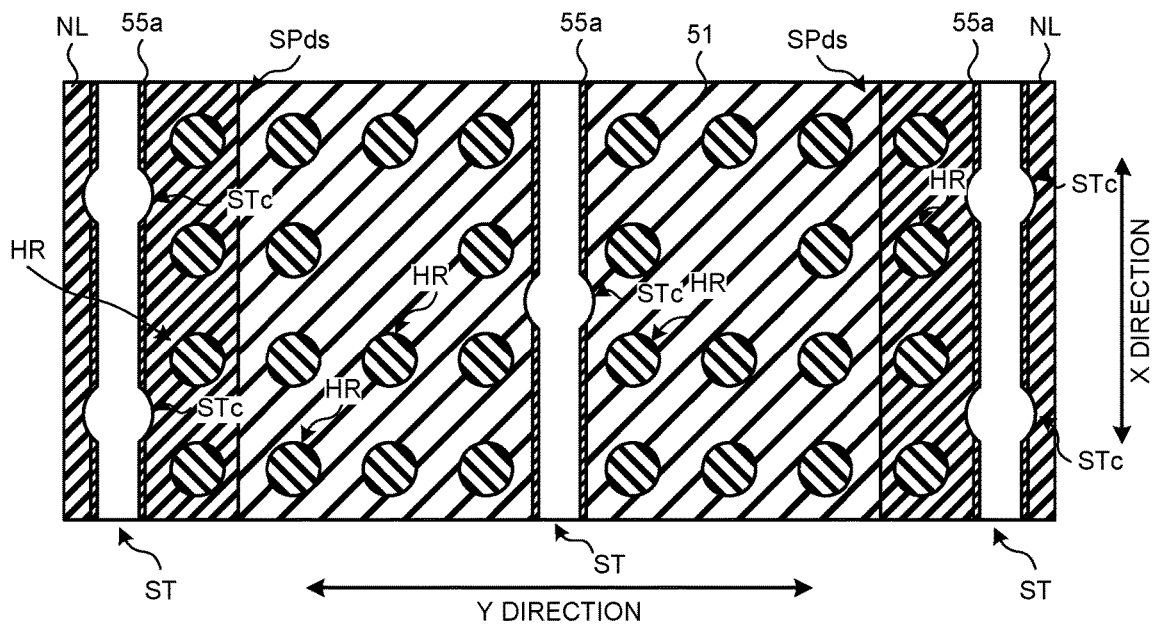

FIGS. 9C and 10C illustrate transverse cross sections at a freely selected level of height of the insulating layer NL in the stepped region SR.

As illustrated in FIGS. 9A to 9C, the slits ST are formed so as to extend in a direction along the X direction, and penetrate the insulating layers 52 and 51 and the stacked body LMs to reach the source line SL. The insulating layer 55a is formed so as to partially fill the slits ST. The insulating layer 55a is formed on the top face of the insulating layer 52 and on the sidewalls of the slits ST, as well as to partially fill the slits ST up to a predetermined level of height. Note the drawings hereinafter will not illustrate the insulating layer 55a on the top face of the insulating layer 52.

The level of height of the insulating layer 55a filled in the slits ST preferably measures, for example, a half or lower than the level of height of the top face of the stacked body LMs. Hence, the plate-like contact LI will have a sufficient volume of the conductive layer 22 that is filled later on the insulating layer 55a in the slits ST, and can reduce the interconnect resistance.

As illustrated in FIGS. 10A to 10C, holes STc that are processed later into the contact portions LIc are formed at predetermined positions of the slits ST in the stepped region SR. Now, the plurality of slits ST illustrated in FIG. 10B represents, from the right to the left in the drawing, cross sections of a portion off the hole STc, the hole STc, and a portion off the hole STc.

As illustrated in FIGS. 10A and 10B, each hole STc penetrates the insulating layers 52 and 51, the stacked body LMs, and the insulating layer 55a filled in the lower portion of each slit ST to reach the source line SL, while expanding the width of the slit ST formed by the processes illustrated in FIGS. 9A to 9C. That is, at the site of formation of each hole STc, the source line SL exposes to the bottom face of the slit ST.

Since the slit ST is widened as a result of formation of the hole STc, so that at the site of the hole STc, the insulating layer 55a is removed from the sidewalls, opposed in the Y direction, of the slit ST. Hence, the hole STc will have, exposed on both side faces thereof in the Y direction, the end faces of the insulating layers NL and OL of the stacked body LMs.

As illustrated in FIG. 10C, each hole STc is preferably formed at a position between the columnar portions HR in the X direction, while not being aligned in the Y direction with each of the plurality of columnar portions HR that is lined up in the X direction neighboring to the slit ST. In this case, the distance from the end in the Y direction of the contact portion LIc to the columnar portion HR neighboring to the slit ST may be made longer than in a case where both are aligned in the Y direction. Hence, the contact portion LIc and the columnar portion HR may be suppressed from contacting, typically due to misalignment in the process of forming the hole STc, or inclination of the columnar portion HR.

The hole STc is also formed in the X direction typically between the holes STc of the neighboring slit ST. In addition, the interval between the holes STc, which are arranged intermittently in the X direction in a single slit ST, is typically set to a half or shorter than the distance between the slits ST neighboring in the Y direction.

Note, in the processes illustrated in FIGS. 10A to 10C, the hole STc is not formed in the slit ST of the memory region MR. Prior to, or subsequent to the processes illustrated in FIGS. 10A to 10C, the insulating layer 55a is removed from the inside of the slit ST in the memory region MR. Hence, the end faces of the insulating layers NL and OL of the stacked body LMs expose to the side faces of the slit ST, which are opposed in the Y direction and extend in a direction along the X direction. To the bottom face of the slit ST, the source line SL exposes.

When removing the insulating layer 55a from the inside of the slits ST in the memory region MR, the slits ST in the stepped region SR are preliminarily covered with a mask layer such as a photoresist layer. Hence, the insulating layer 55a in the slit ST in the stepped region SR is suppressed from being removed.

Figure 11A:
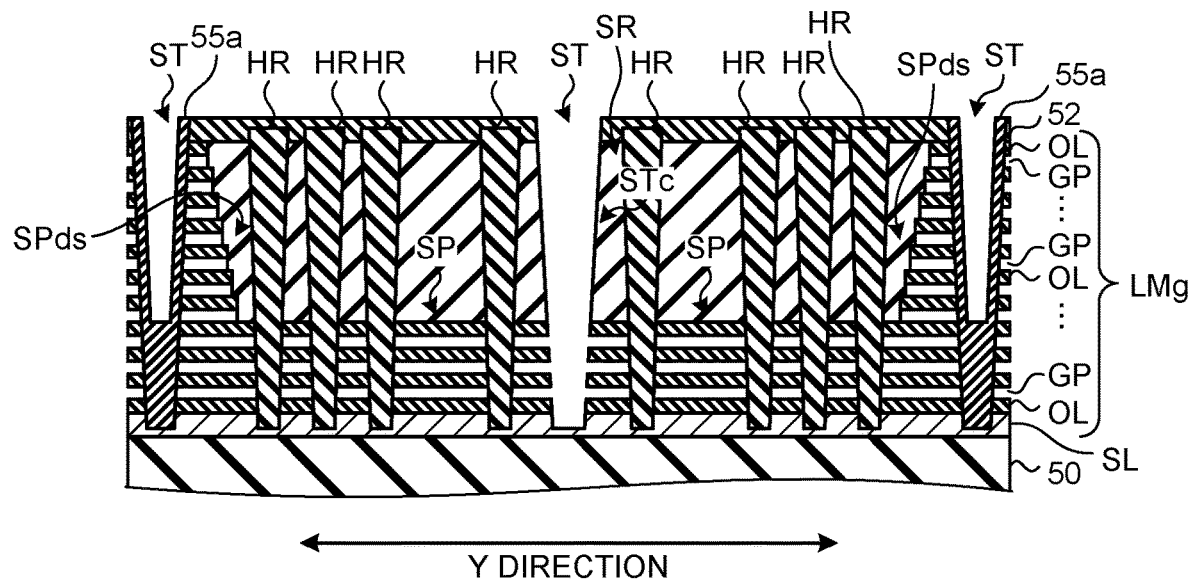
FIGS. 11A and 11B are diagrams illustrating exemplary procedures of the method for manufacturing the semiconductor memory device according to the embodiment.
Figure 11B:
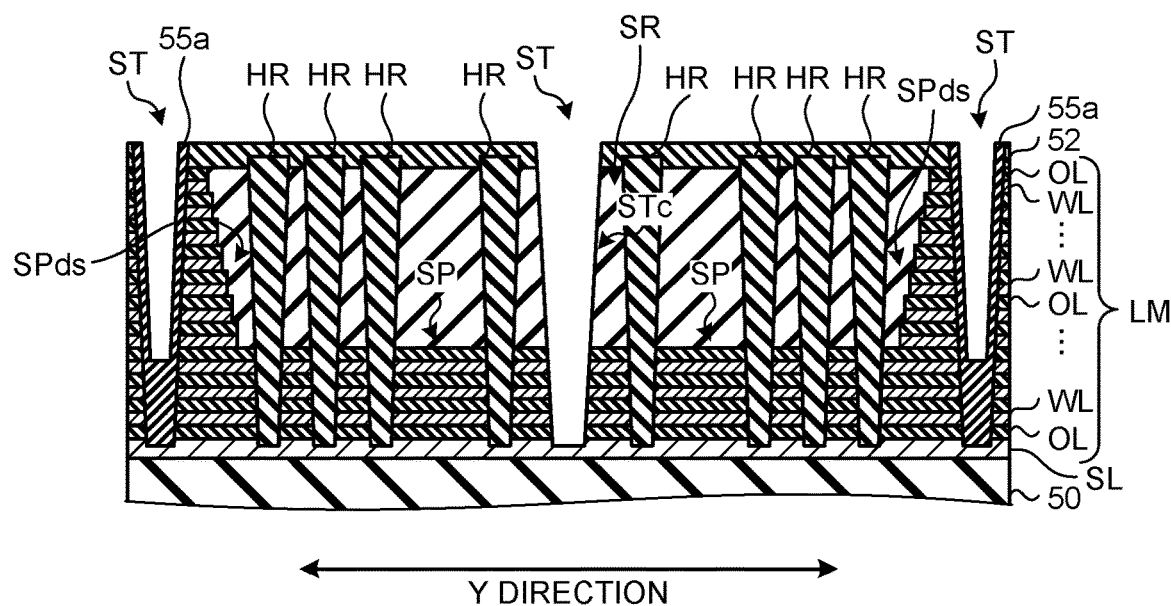

Next, FIGS. 11A and 11B illustrate appearances during replacement of the insulating layer NL with the word line WL. FIGS. 11A and 11B illustrate cross sections of the stepped region SR taken along the Y direction.

As illustrated in FIG. 11A, a chemical liquid such as hot phosphoric acid is injected through the slits ST to remove the insulating layer NL of the stacked body LMs. In the stepped region SR, a part of the sidewall of each slit ST is covered with the insulating layer 55a, meanwhile the insulating layer 55a has been removed in the hole STc. Hence, the chemical liquid can permeate through the hole STc into the stacked body LMs, to remove the insulating layer NL.

On the other hand, in the memory region MR, since the insulating layer 55a has been removed from the entire range of the sidewall of each slit ST, so that the chemical liquid can permeate through the entire range of the sidewall of the slit ST into the stacked body LMs, to remove the insulating layer NL.

A stacked body LMg having a plurality of gap layers GP is thus formed. The stacked body LMg has become fragile as a result of having the plurality of gap layers GP. In the stepped region SR and at the end portions of the stacked body LMg, the plurality of columnar portions HR supports such fragile stacked body LMg. In the memory region MR, the plurality of pillars PL supports such fragile stacked body LMg. These columnar portions HR and the pillars PL can suppress the thus remained insulating layer OL from warping, or can suppress the stacked body LMg from distorting or collapsing.

As illustrated in FIG. 11B, a source gas of a conductor such as tungsten or molybdenum is injected through the slit ST, so as to fill the gap layers GP in the stacked body LMg, thus forming the plurality of word lines WL. Also in this case, the source gas permeates into the stacked body LMg, through the holes STc in the stepped region SR, and through the entire range of the slits ST in the memory region MR, to form the word lines WL.

Hence, the stacked body LM in which the plurality of word lines WL and the plurality of insulating layers OL are alternately stacked one by one is formed. Note that the replacement of the insulating layer NL with the word line WL illustrated in FIGS. 11A and 11B may be occasionally referred to as a replacement process.

Figure 12A:
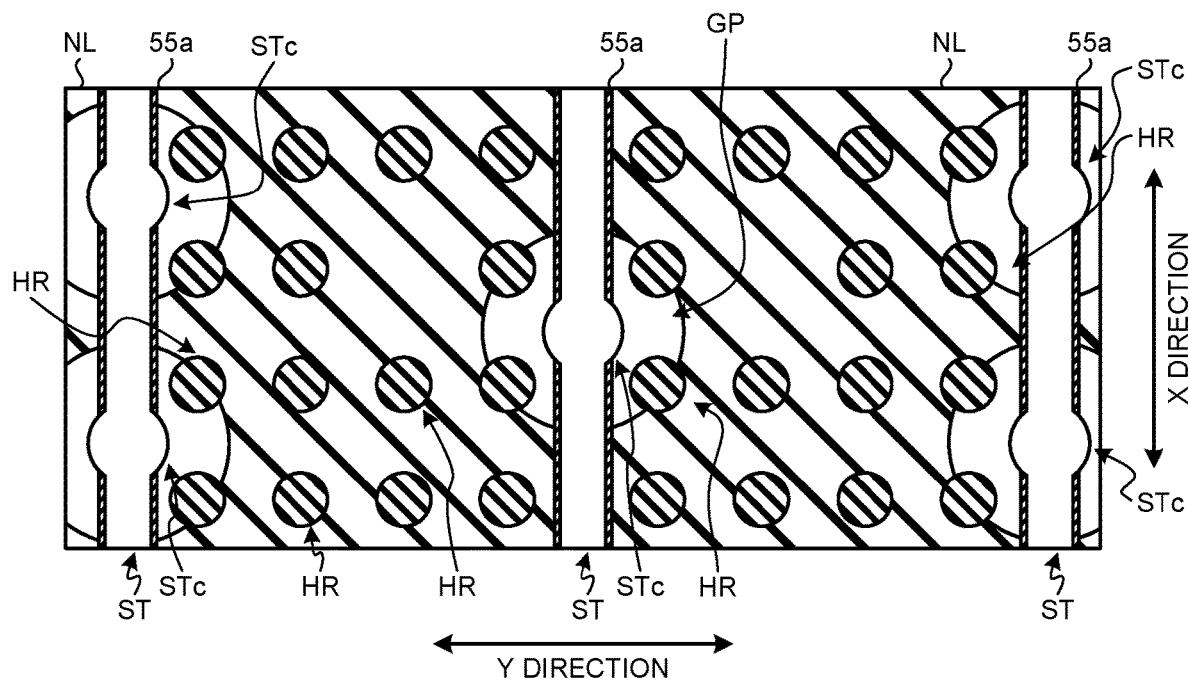
FIGS. 12A and 12B are diagrams illustrating exemplary procedures of the method for manufacturing the semiconductor memory device according to the embodiment.
Figure 12B:
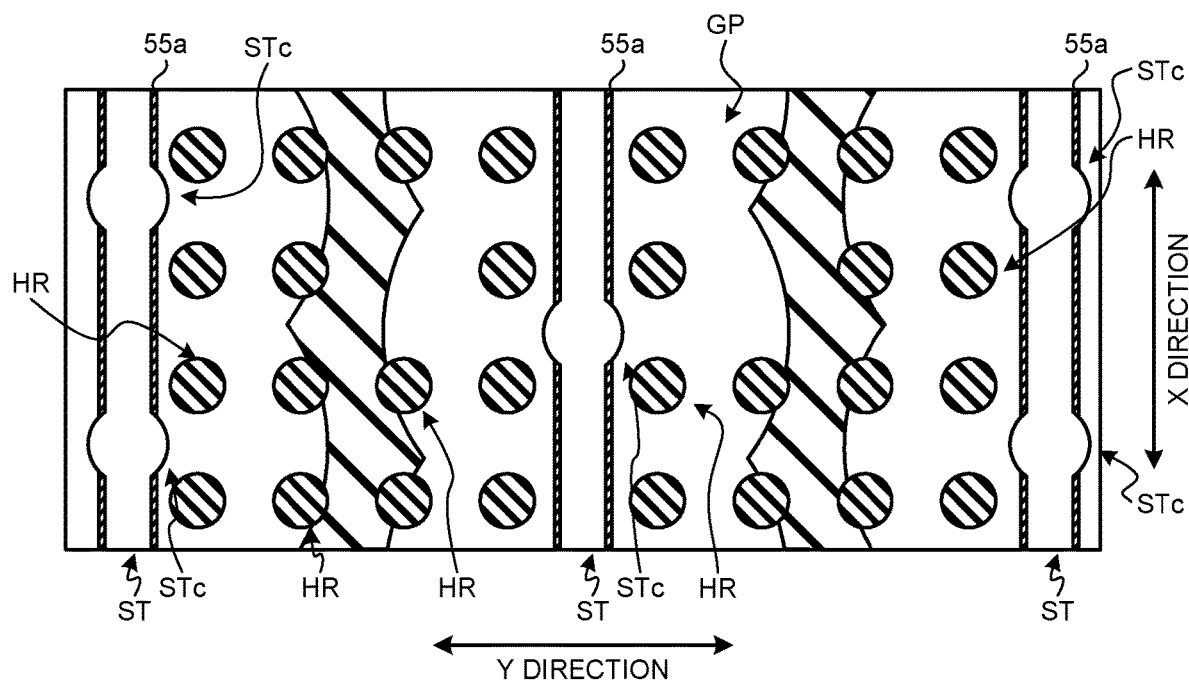

Now, FIGS. 12A and 12B illustrate more detailed appearances during the replacement process. FIGS. 12A and 12B illustrate transverse cross sections taken at a level of height of a freely selected insulating layer NL in the stepped region SR.

As illustrated in FIG. 12A, upon start of injection of the chemical liquid such as hot phosphoric acid, the chemical liquid spreads through the hole STc concentrically into the stacked body LMs in the stepped region SR, to remove the insulating layer NL.

In this process, the distance among the plurality of holes STc formed in one slit ST preferably measures a half or shorter than the distance between the adjacent slits ST, as described previously. Hence, the insulating layer NL in the region between the adjacent slits ST is efficiently removed out through the holes STc that reside on both sides in the Y direction.

Also as described previously, the holes STc are preferably arranged between the holes STc of the slits ST neighboring in the X direction, while being off-aligned in the Y direction with the holes STc formed in the neighboring slits ST. Hence, the region of the insulating layer NL to be removed through a single hole STc can be reduced, thus making the removal of the insulating layer NL more efficient.

As illustrated in FIG. 12B, as the chemical liquid permeates into the stacked body LMs, the insulating layer NL in the region between the neighboring slits ST is comprehensively removed almost without being left, by virtue of the aforementioned arrangement of the plurality of holes STc.

Figure 13A:
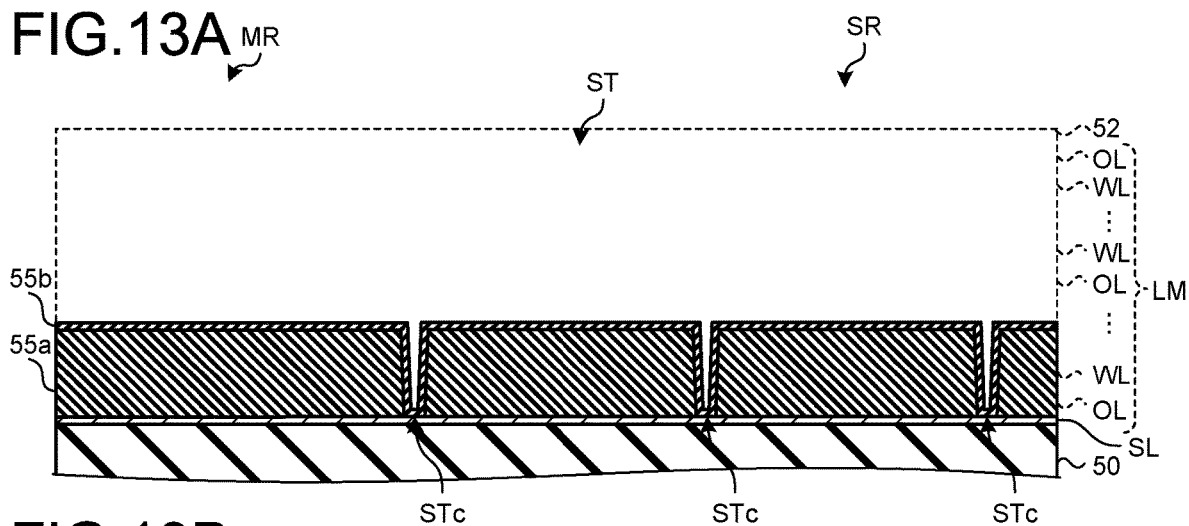
FIGS. 13A to 13C are diagrams illustrating exemplary procedures of the method for manufacturing the semiconductor memory device according to the embodiment.
Figure 13B:
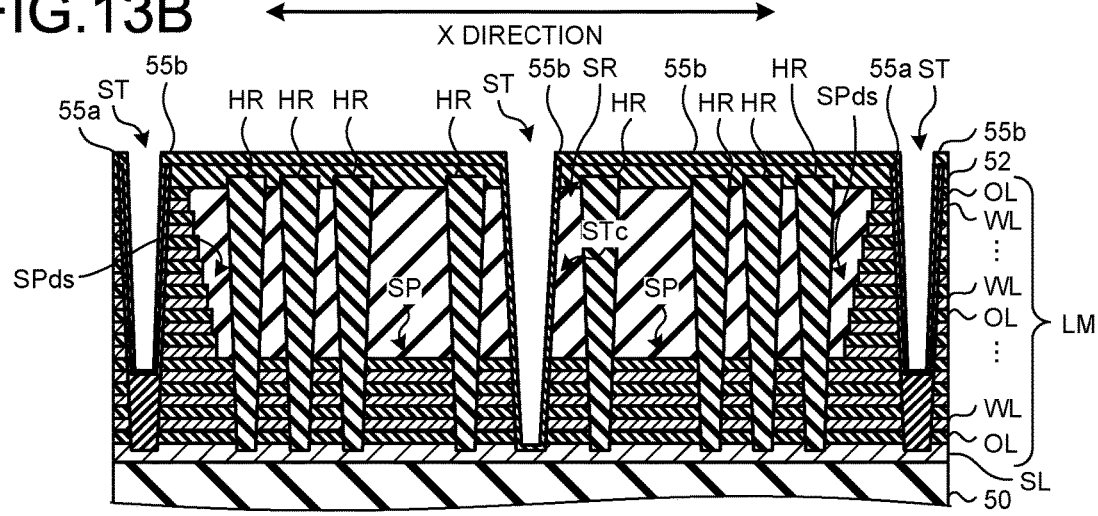
Figure 13C:
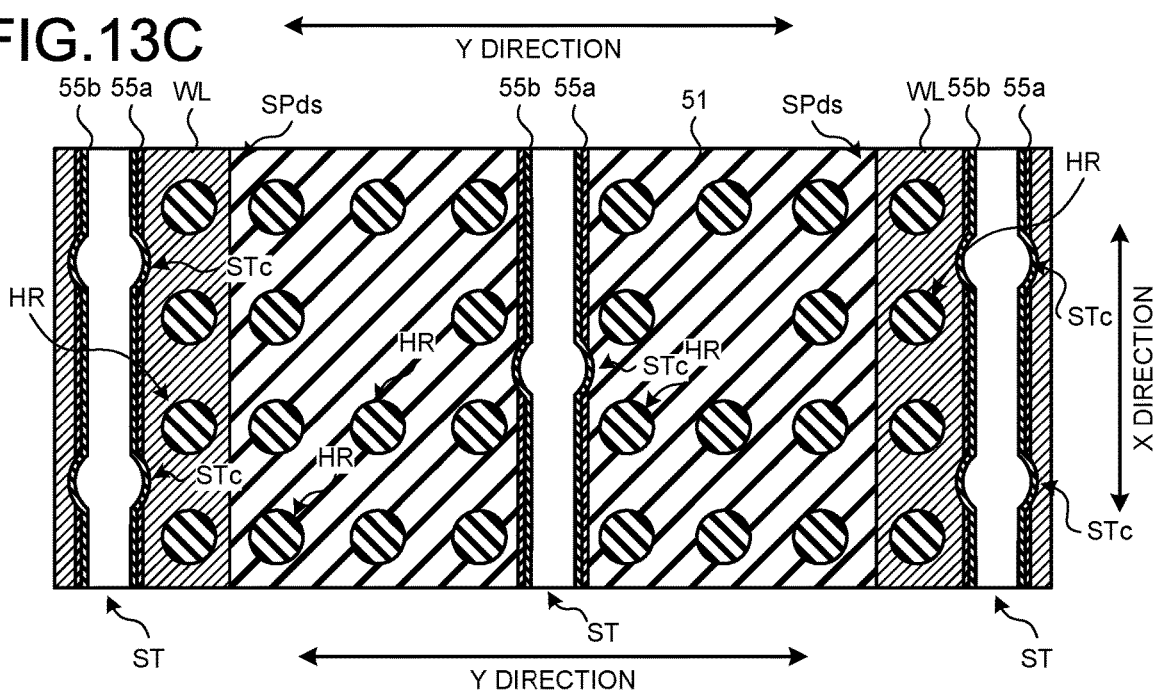

Next, FIGS. 13A to 13C illustrate appearance during formation of the insulating layer 55b. FIG. 13A illustrates a cross section taken along the X direction of the slit ST, and corresponds to FIG. 2B. FIG. 13B illustrates a cross section of the stepped region SR taken along the Y direction. FIG. 13C illustrates a transverse cross section taken at a level of height of a freely selected word line WL in the stepped region SR.

As illustrated in FIGS. 13A to 13C, the insulating layer 55b is formed on the top face of the insulating layer 52, as well as over the side face and the bottom face of each slit ST. At the site of formation of the hole STc, the insulating layer 55b is formed on the end faces of the word line WL and the insulating layer OL of the stacked body LM which are exposed to the side face of each slits ST; on the face, opposed to the hole STc, of the insulating layer 55a filled in the lower portion of each slit ST; and on the source line SL that exposes to the bottom face of each slit ST. Out of the site of formation of the hole STc, the insulating layer 55b is formed on the insulating layer 55a that covers the side face of the slit ST, and on the top face of the insulating layer 55a that fills the lower portion of the slit ST.

The insulating layer 55b on the bottom face of the hole STc is then removed to expose the source line SL, and the conductive layer 22 is filled in the slit ST. When removing the insulating layer 55b on the bottom face of the hole STc, the insulating layer 55b may also be removed from the top face of the insulating layer 52, and from the top face of the insulating layer 55a filled in the lower portion of the slit ST. Alternatively, the insulating layer 55b on the face, opposed to the hole STc, of the insulating layer 55a that is filled in the lower portion of the slit ST may be removed.

Meanwhile in the memory region MR, the insulating layer 55b is formed on the top face of the insulating layer 52, as well as on the slit ST on the side face thereof where the stacked body LM exposes, and on the bottom face where the source line SL exposes. Also in the memory region MR parallelly with the process in the stepped region SR, the insulating layer 55b on the bottom face of the slit ST is removed to expose the source line SL, and the conductive layer 22 is filled in the slit ST. When removing the insulating layer 55b on the bottom face of the slit ST, the insulating layer 55b may also be removed from the top face of the insulating layer 52.

Now, FIGS. 14Aa to 14Bd illustrate more detailed appearances during formation of the various layers. FIGS. 14Aa to Ad are cross-sectional views, taken along the Y direction of the slit ST in the stepped region SR, illustrating a cross section of the hole STc. FIGS. 14Ba to Bd are cross-sectional views, taken along the Y direction of the slit ST in the stepped region SR, illustrating a cross section of a portion off the hole STc.

Note that appearances during formation of the individual layers of the slit ST in the memory region MR are similar to the appearances during formation of the individual layers at the hole STc illustrated in FIGS. 14Aa to Ad, and will therefore be neither illustrated nor explained.

As illustrated in FIG. 14Aa, subsequent to the removal of the insulating layer NL of the stacked body LMs through the holes STc formed in the slit ST, and prior to the formation of the word line WL in the gap layer GP, the block layers 61 is formed on the upper and lower faces of the insulating layer OL that adjoins to the gap layer GP in the stacking direction of the stacked body LMg. In this process in the portion of the hole STc, the block layer 61 is also formed on the end face of the insulating layer OL opposed to the slit ST.

As illustrated in FIG. 14Ab, the barrier metal layer 24 is further formed on the upper and lower faces of the insulating layer OL that adjoins to the gap layer GP in the stacking direction of the stacked body LMg. In this process, the barrier metal layer 24 is also formed on the end face of the insulating layer OL opposed to the slit ST. Hence, the block layer 61 formed on the upper and lower faces and the end faces of the insulating layer OL is covered with the barrier metal layer 24.

As illustrated in FIG. 14Ac, tungsten, molybdenum, or the like is filled in the gap layer GP to form the word line WL. In this process, the conductive layer such as tungsten or molybdenum is also formed in the slit ST. The conductive layer formed in the slit ST is then removed.

In this process, at least the barrier metal layer 24, from among the block layer 61 and the barrier metal layer 24 formed in the slit ST, is also removed together with the conductive layer. On the other hand, the block layer 61 may remain occasionally on the end face of the insulating layer OL opposed to the slit ST. The block layer 61, since being an insulating layer such as an aluminum oxide layer, will not adversely affect the electrical characteristics of the plate-like contact LI and so forth, even if left unremoved inside the slit ST.

As illustrated in FIG. 14Ad, the insulating layer 55b that covers a sidewall of the slit ST is formed. The barrier metal layer 25 that covers the insulating layer 55b is then formed, and the conductive layer 22 is filled in the slit ST.

The contact portion LIc having the aforementioned layer structure illustrated in FIG. 4A is thus formed.

As illustrated in FIG. 14Ba, when forming the block layer 61 prior to the formation of the word line WL, a portion of the slit ST besides the hole STc in the stepped region SR has the insulating layer 55a formed on the sidewall thereof. The block layer 61 is therefore formed on the upper and lower faces of the insulating layer OL, and also on the insulating layer 55a in the slit ST. On the face, opposed to the gap layer GP, of the insulating layer 55a, the block layer 61 is formed at the level of height of the gap layer GP. The end face of the insulating layer OL, on the side thereof opposed to the slit ST, is covered with the insulating layer 55a, so that the block layer 61 is not formed thereon.

As illustrated in FIG. 14Bb, when forming the barrier metal layer 24 thereafter, the barrier metal layer 24 is formed on the upper and lower faces of the insulating layer OL, as well as on the insulating layer 55a in the slit ST, and on the face, opposed to the gap layer GP, of the insulating layer 55a, at the level of height of the gap layer GP. The block layer 61, which is formed on the upper and lower faces of the insulating layer OL, on the insulating layer 55a in the slit ST, and on the face, opposed to the gap layer GP, of the insulating layer 55a, at the level of height of the gap layer GP, is covered with the barrier metal layer 24.

As illustrated in FIG. 14Bc, when forming the word line WL, the conductive layer such as tungsten or molybdenum layer formed in the slit ST is removed. In this process, also the barrier metal layer 24 formed in the slit ST is removed together with the conductive layer. On the other hand, the block layer 61 may remain occasionally on the face, opposed to the slit ST, of the insulating layer 55a.

As illustrated in FIG. 14Bd, the insulating layer 55b that covers a sidewall of the slit ST is formed. The barrier metal layer 25 that covers the insulating layer 55b is then formed, and the conductive layer 22 is filled in the slit ST.

The plate-like contact LI having the aforementioned layer structure illustrated in FIG. 4B is thus formed in the stepped region SR.

Thereafter, on each stair of the stepped portion SP, a hole that reaches the uppermost word line WL that belongs to that stair is formed, the insulating layer 54 is formed on the sidewall of the hole, and the conductive layer 21 is filled inside the insulating layer 54, to form the contact CC that connects with each of the plurality of word lines WL.

A hole is also formed so as to penetrate the insulating layer 52 and the stacked body LMs to reach the lower interconnect D2, the insulating layer 57 is formed on the sidewall of the hole, and the conductive layer 23 is filled inside the insulating layer 57, to form the through-contact C4 that is electrically connected through the lower interconnect D2 to the peripheral circuit CUA. Note that the holes in which the through-contact C4 is formed may be collectively formed, parallelly with the aforementioned processes for forming the slit ST illustrated in FIGS. 9A to 9C.

The insulating layer 53 is formed on the insulating layer 52, and a plug V0 is formed so as to penetrate the insulating layer 53, and so as to connect with each of the plate-like contact LI, the through-contact C4, and the contact CC. The plug CH is formed so as to penetrate the insulating layers 53 and 52, and to connect with the pillar PL. The upper interconnect MX, the bit line BL and so forth are further formed so as to connect with each of the plugs V0 and CH.

The semiconductor memory device 1 according to the embodiment is thus manufactured.

In a process for manufacturing a semiconductor memory device such as a three-dimensional nonvolatile memory, the replacement process may occasionally take place so as to replace the sacrificial layer such as a silicon nitride layer, with the conductive layer such as a tungsten layer. During the replacement process, the structure of the stacked body becomes fragile due to removal of the sacrificial layer. This would occasionally result in warpage of the insulating layer such as a silicon oxide layer that remains in the stacked body, or distortion or collapse of the stacked body per se.

The insulating layer typically formed above the stepped portion can generate a tensile stress. The stacked body is thus placed under compressive stress. The stepped portion, which is covered with such insulating layer, is likely to have stress concentrated thereon. Even if the columnar portions that support the stacked body were arranged in the stepped portion, influence of such stress would not fully be suppressed, due to limit in densifying the arrangement of the columnar portions.

Now, FIGS. 15A and 15B illustrate schematic views in the stepped portion of the stacked body, from which the sacrificial layer has been removed. FIG. 15A is a transverse cross-sectional view taken at a level of height of a freely selected insulating layer OL', illustrating an exemplary case where the entire range of a slit ST' takes part in the replacement. FIG. 15B is a transverse cross-sectional view taken at a level of height of a freely selected insulating layer OL, illustrating an exemplary case where the hole STc is provided in the slits ST.

In a case illustrated in FIG. 15A where the replacement takes place with use of the entire slit ST' without forming the insulating layer on the sidewall of the slit ST', a region FB' away from the slit ST' and surrounded by columnar portions HR' will have a relatively rigid structure like a fixed end beam, in which the insulating layer OL', which is adjoined by the gap layers on the upper and lower sides, is supported at the circumference by the columnar portions HR'.

On the other hand, a region CL' that falls between the slit ST' and the columnar portion HR' neighboring the slit ST' will have a more fragile structure like a cantilever, in which there is no member that supports the end portion of the insulating layer OL' on the side opposed to the slit ST'.

In the region CL', the insulating layer OL' will have a largest risk of causing deflection, at a position where there is a maximum distance MXc' between the slit ST' and the columnar portion HR'. A simulation-based analysis has revealed that it is preferable to limit the maximum distance MXc' to a predetermined threshold value in the cantilever-like region CL', in order to suppress the deflection of the insulating layer OL' within an allowable range.

However, due to the aforementioned limit in densifying the arrangement of the columnar portions HR', the density of arrangement of the columnar portions HR' tends to be lower than the density of arrangement of the pillars in the memory region. For this reason, the risk of deflection of the insulating layer OL' would become higher in the stepped portion than in the memory region, and the risk of deflection of the insulating layer OL' would become even higher in the region CL' close to the slit ST' in the stepped portion.

The simulation-based analysis has also revealed that the risk of deflection further increases in the insulating layer OL' on the lower side of the stacked body that is close to the source line. The source line and a portion below the source line typically have a rigid structure made of a single material, as compared with the stacked body having the multi-layered structure. Hence the interfacial area between the source line and the stacked body is presumably one area susceptible to the stress.

Once the insulating layer remained in the stacked body deflects, the thickness of the word line to be formed thereafter would vary, or the gap layer would be obstructed by the insulating layers adjoined in the stacking direction, possibly resulting in breakage of the word line.

In a case illustrated in FIG. 15B where the hole STc is provided to the slit ST, and the replacement takes place through the hole STc, the insulating layer OL in a region FB is supported at the circumference thereof by the columnar portions HR, so that the risk of deflection of the insulating layer OL is considered to be almost equivalent to that in the case illustrated in FIG. 15A.

On the other hand, in the region between the slit ST and the columnar portion HR neighboring the slit ST, but excluding the vicinity of the hole STc, the insulating layer OL is supported, at the end portion thereof on the side opposed to the slit ST, with the insulating layer 55a on the sidewall of the slit ST, and is given as a relatively rigid structure like a fixed end beam. Hence the insulating layer OL is formed into a cantilever shape, only in a region CL around the hole STc.

In addition, in the region CL, a maximum distance MXc between the slit ST and the columnar portion HR, at the site where the risk of deflection of the insulating layer OL becomes maximum, is typically shorter than the maximum distance MXc' given in FIG. 15A, by virtue of the swelling of the end portion, in the Y direction, of the hole STc towards the columnar portion HR. Hence, the maximum distance MXc may be more easily reduced to or below the aforementioned predetermined threshold value, making it possible to limit the deflection of the insulating layer OL within an allowable range.

Also as described previously, the site of formation of the hole STc is adjusted so that the hole STc provided in the slit ST and the columnar portion HR neighboring the slit ST will not be aligned in the Y direction. Hence a minimum distance MNc between the slit ST and the columnar portion HR is suppressed from becoming too small, and so that the plate-like contact LI and the columnar portion HR are suppressed from contacting with each other.

According to the semiconductor memory device 1 of the embodiment, the plate-like contacts LI has the plurality of contact portions LIc that is intermittently arranged in the stepped portion SP in the X direction, and penetrates the stacked body LM to connect with the source line SL.

That is, the strength of the stacked body LMg during the replacement can be increased, by carrying out the replacement through the holes STc that will later become the contact portions LIc.

In addition, by making these holes STc into the contact portions LIc after the replacement, conduction through the contact portions LIc with the source line SL is established, thus enabling the plate-like contact LI to function as the source line contact.

According to the semiconductor memory device 1 of the embodiment, the plurality of contact portions LIc is connected in a direction along the X direction, by the conductive layer 22 that extends in the X direction at the upper position of the plate-like contact LI. Hence, interconnect resistance of the plate-like contact LI may be reduced, to improve the electrical characteristics.

According to the semiconductor memory device 1 of the embodiment, in the stepped portion SP, the plate-like contact LI contains, in the lower portion thereof, the insulating layer 55a that is divided in a direction along the X direction by the plurality of contact portions LIc. The insulating layer OL in the lower portion of the stacked body LMg can therefore be more firmly supported during the replacement, by the insulating layer 55a in the lower portion of the slit ST.

According to the semiconductor memory device 1 of the embodiment, the conductive layer 22 in the memory region MR is connected to the source line SL continuously in the X direction. Interconnect resistance of the plate-like contact LI in the memory region MR may be thus reduced.

According to the semiconductor memory device 1 of the embodiment, the plurality of contact portions LIc is arranged, while being individually shifted from positions that are opposed in the Y direction with the columnar portions HR that are lined up in the X direction neighboring the plate-like contact LI. Hence, the minimum distance MNc between the plate-like contact LI and the columnar portion HR may be maintained at a predetermined value or larger, whereby the plate-like contact LI and the columnar portion HR are suppressed from contacting with each other.

According to the semiconductor memory device 1 of the embodiment, the width in the Y direction of the plurality of contact portions LIc is wider than the width in the Y direction of the other portion of the plate-like contact LI. Accordingly as described previously, the maximum distance MXc between the hole STc and the columnar portion HR in the cantilever-like region CL may be reduced, whereby the risk of deflection of the insulating layer OL during the replacement may further be reduced.

According to the semiconductor memory device 1 of the embodiment, the plurality of contact portions LIc that belongs to one plate-like contact LI is arranged, while being shifted from the positions opposed in the Y direction to each of the plurality of contact portions LIc that belongs to the neighboring plate-like contact LI. Accordingly, the replacement process in the region between the neighboring plate-like contacts LI may be carried out efficiently.

According to the semiconductor memory device 1 of the embodiment, the distance among the plurality of contact portions LIc that belongs to one plate-like contact LI measures a half or shorter than the distance between the neighboring plate-like contacts LI. Accordingly, the replacement process in the region between the neighboring plate-like contacts LI may be carried out even more efficiently.

First Modified Example

Next, a semiconductor memory device 2 according to a first modified example of the embodiment will be explained, referring to FIG. 16. In the semiconductor memory device 2 of the first modified example, the arrangement of the contact portions LIc is different from that in the aforementioned embodiment.

Figure 16:
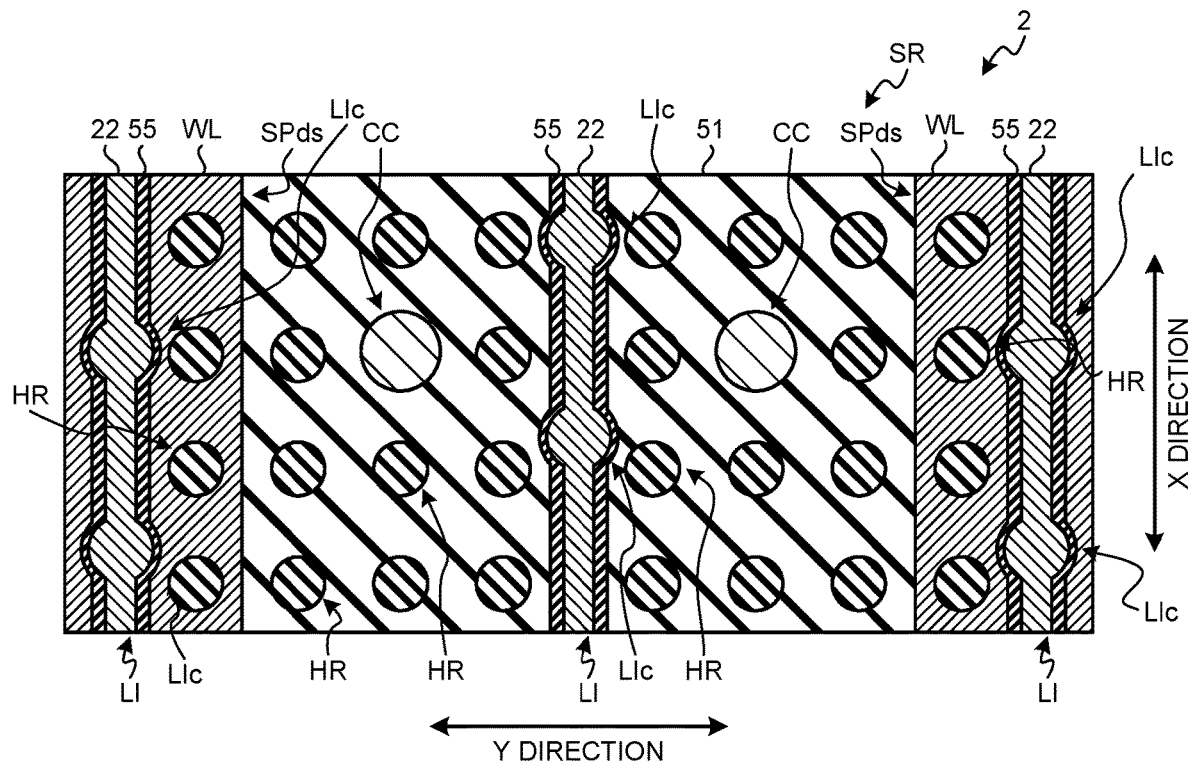
FIG. 16 is a transverse cross-sectional view illustrating an exemplary structure of a semiconductor memory device according to a first modified example of the embodiment.

FIG. 16 is a transverse cross-sectional view illustrating an exemplary structure of the semiconductor memory device 2 according to the first modified example of the embodiment. More specifically, FIG. 16 illustrates a transverse cross section of the stepped region SR, taken at a level of height of a freely selected word line WL, from among the plurality of word lines WL provided to the semiconductor memory device 2 of the first modified example.

As illustrated in FIG. 16, the contact portions LIc in the semiconductor memory device 2 of the first modified example are arranged without paying special attention to the arrangement of the columnar portions HR. At least a part of contact portions LIc are thus aligned in the Y direction with a part of the columnar portions HR. Accordingly, in the region where the insulating layer OL has a cantilever-like structure, the maximum distance between the contact portion LIc and the columnar portion HR may further be shortened, whereby the risk of deflection of the insulating layer OL may further be reduced.

That being so, the contact portion LIc and the columnar portion HR are preferably arranged while considering the minimum distance between the contact portion LIc and the columnar portion HR, so that the contact portion LIc and the columnar portion HR will not come into contact.

According to the semiconductor memory device 2 of the first modified example, the maximum distance between the contact portion LIc and the columnar portion HR may be reduced, and the same effects as those of the aforementioned semiconductor memory device 1 of the embodiment are obtainable.

Second Modified Example

Next, a semiconductor memory device 3 according to a second modified example of the embodiment will be described, referring to FIGS. 17 to 18B. In the semiconductor memory device 3 of the second modified example, the arrangement of the contact portions LIc is different from that in the aforementioned embodiment.

Figure 17:
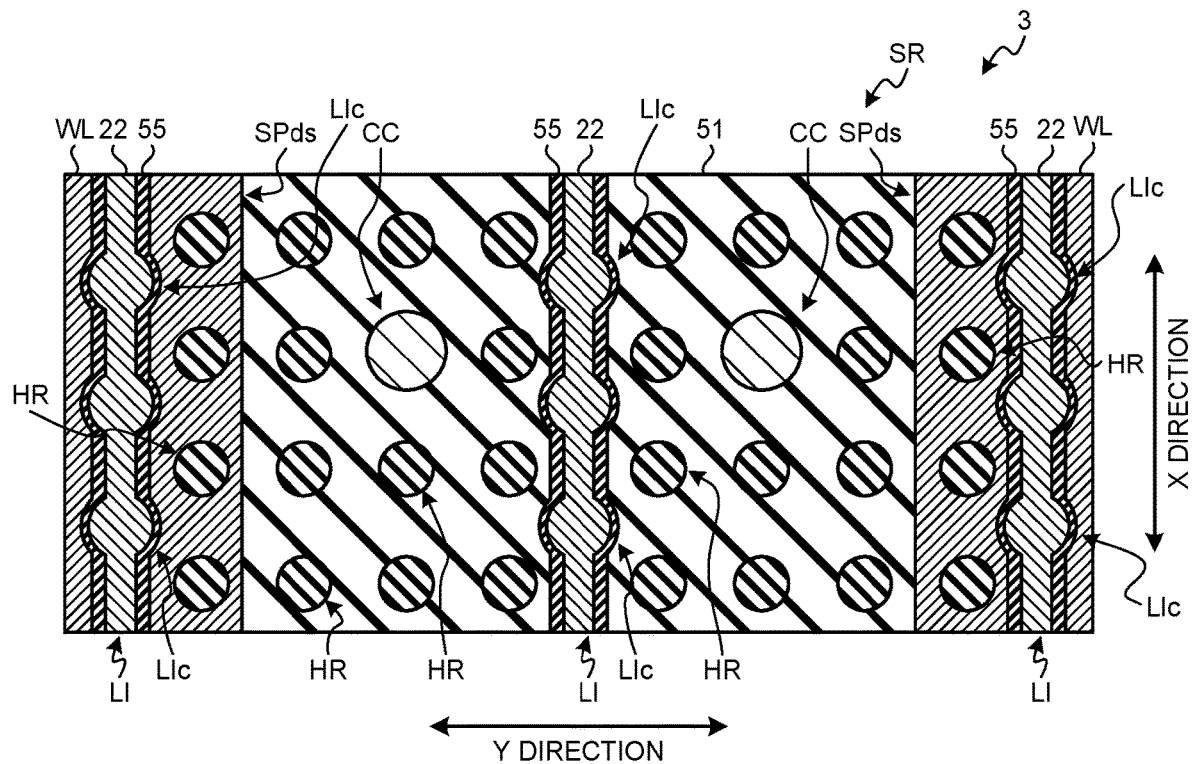
FIG. 17 is a transverse cross-sectional view illustrating an exemplary structure of a semiconductor memory device according to a second modified example of the embodiment.

FIG. 17 is a transverse cross-sectional view illustrating an exemplary structure of the semiconductor memory device 3 according to the second modified example of the embodiment. More specifically, FIG. 17 illustrates a transverse cross section of the stepped region SR, taken at a level of height of a freely selected word line WL, from among the plurality of word lines WL provided to the semiconductor memory device 3 of the second modified example.

As illustrated in FIG. 17, in the semiconductor memory device 3 of the second modified example, the contact portions LIc that represent the plurality of first contact portions contained in the plate-like contact LI that represents the first plate-like portion, and the contact portions LIc that represent the plurality of second contact portions contained in the plate-like contact LI that represents the second plate-like portion neighboring the plate-like contact LI in the Y direction, are juxtaposed in the Y direction.

In the aforementioned embodiment, the contact portions LIc contained in the neighboring plate-like contacts LI have been arranged while being off-aligned in the Y direction, whereby the efficiency of the replacement process is successfully improved. Considering this, in the case where the contact portions LIc of the neighboring plate-like contacts LI are arranged while being aligned in the Y direction as in the semiconductor memory device 3 of the second modified example, the distance among the plurality of contact portions LIc that belongs to one plate-like contact LI is preferably set to a quarter or shorter than the distance between the neighboring plate-like contacts LI.

Figure 18A:
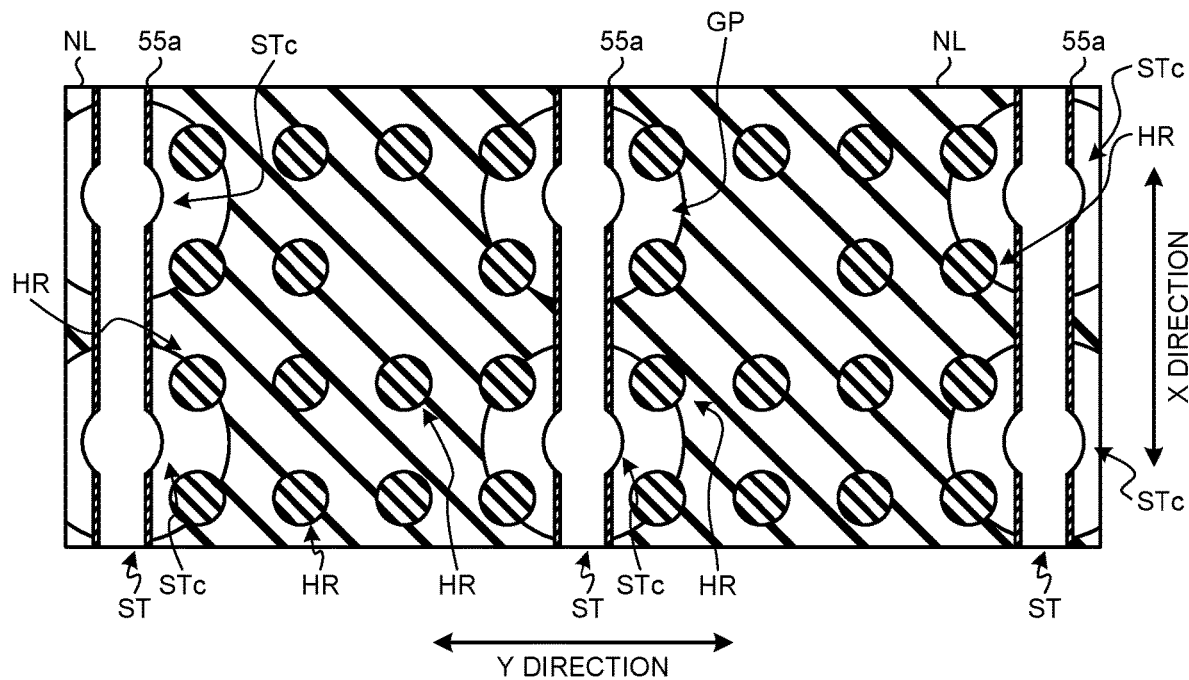
FIGS. 18A and 18B are schematic diagrams illustrating an exemplary replacement process for the semiconductor memory device according to the second modified example of the embodiment.
Figure 18B:
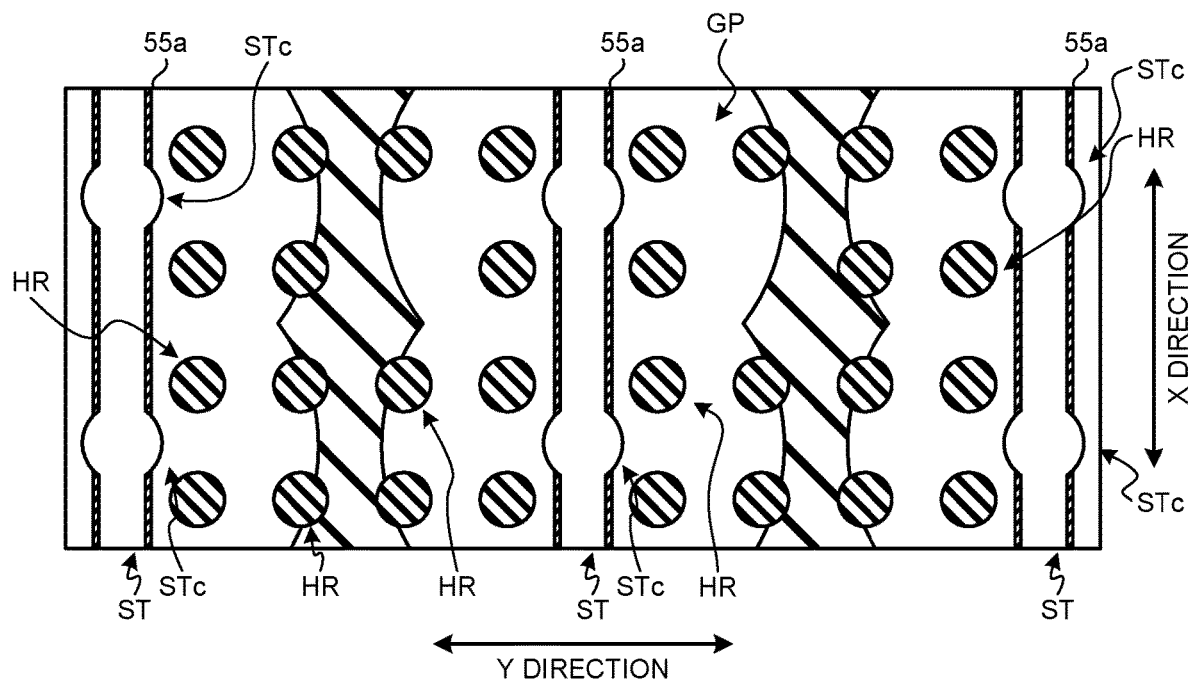

FIGS. 18A and 18B are schematic diagrams illustrating an exemplary replacement process for the semiconductor memory device 3 according to the second modified example of the embodiment. More specifically, FIGS. 18A and 18B illustrate a case of replacement where the distance between the contact portions LIc that belong to one plate-like contact LI is set almost equal to that in the aforementioned embodiment, in the arrangement in which the contact portions LIc of the neighboring plate-like contacts LI are aligned in the Y direction. FIGS. 18A and 18B illustrate transverse cross sections taken at a level of height of a freely selected insulating layer NL in the stepped region SR, and respectively correspond to FIGS. 12A and 12B illustrating the aforementioned embodiment.

As illustrated in FIG. 18A, upon start of injection of the chemical liquid such as hot phosphoric acid, the chemical liquid spreads through the hole STc concentrically into the stacked body LMs in the stepped region SR, to remove the insulating layer NL.

As seen in FIG. 18B, even if the chemical liquid has permeated into the stacked body LMs, and a predetermined length of time, typically equivalent to that in the aforementioned embodiment illustrated in FIG. 12B, has elapsed, there still remains a relatively large area occupied by the insulating layer NL left unremoved, at a site opposed in the Y direction to a portion of one slit ST between the neighboring holes STc.

Now efficiency of the replacement process may be improved by adjusting the distance between the plurality of contact portions LIc that belongs to one plate-like contact LI, to a quarter or shorter than the distance between the plate-like contacts LI as described previously, enabling the replacement within a process time equivalent to that in the aforementioned embodiment.

According to the semiconductor memory device 3 of the second modified example, effects comparable to those of the semiconductor memory device 1 of the aforementioned embodiment are obtainable, as a result of adjustment of the distance between the contact portions LIc.

Other Modified Examples

The aforementioned embodiment and the first and second modified examples employ the replacement process through the holes STc in the stepped region SR. Meanwhile, the replacement process may be conducted through the holes STc that are additionally formed in the slits ST arranged in the memory region MR. Since the compressive stress is also exerted on the memory region MR, through the insulating layer 51 that is arranged around the stacked body LMg, so that the replacement process through the holes STc can further enhance the structural strength of the stacked body LMg. In this case, it is preferred to adjust the interval of the contact portions LIc, to suppress the interconnect resistance of the plate-like contact LI in the memory region MR.

In the aforementioned embodiment and the first and second modified examples, the channel layer CN of the pillar PL has been connected to the source line SL at the bottom face. The channel layer CN may alternatively establish contact with the source line SL, on the side face. FIGS. 19A to 19D are diagrams illustrating a part of procedures of a method for manufacturing such a semiconductor memory device, and are more specifically cross sectional views of the memory region MR.

As illustrated in FIG. 19A, in an early stage of the method for manufacturing the semiconductor memory device, a lower source line DSLb, a sacrificial layer SCN, and an upper source line DSLt are stacked in this order on the insulating layer 50 that covers the peripheral circuit. The lower source line DSLb and the upper source line DSLt are typically formed of conductive polysilicon layers. The sacrificial layer SCN is typically a silicon nitride layer.

The stacked body LMs is formed on the upper source line DSLt. In the stacked body LMs, there are formed the pillars PLs that penetrate the stacked body LMs, the upper source line DLSt, and the sacrificial layer SCN to reach the lower source line DSLb; and the slits STs that penetrate the insulating layer 52, the stacked body LMs, and the upper source line DLSt to reach the sacrificial layer SCN. At the bottom of each pillar PLs, there are stacked the block insulating layer BK, a charge storage layer CT, the tunnel insulating layer TN, and the channel layer CN in this order from the lower side.

As illustrated in FIG. 19B, an insulating layer 59 is formed on the sidewall of the slit STs. The insulating layer 59 herein may typically be a part of the aforementioned insulating layer 55a. The sacrificial layer SCN exposed to the bottom face of the slit STs is removed typically with use of a chemical liquid, through the slit STs. Since the slit STs has the insulating layer 59 formed on the side face thereof, so that the insulating layers NL in the stacked body LMs remain unremoved.

Accordingly, the side face of each pillar PLs exposes in the gap produced between the lower source line DSLb and the upper source line DSLt. The side face of each pillar PLs, formed of the block insulating layer BK such as a silicon oxide layer, is not removed by the chemical liquid.

As illustrated in FIG. 19C, a chemical liquid different from the aforementioned chemical liquid is injected through the slit STs, whereby the block insulating layer BK, the charge storage layer CT, and the tunnel insulating layer TN, having been exposed in the gap between the lower source line DSLb and the upper source line DSLt, are sequentially removed. Accordingly, the side face of the channel layer CN exposes in the gap between the lower source line DSLb and the upper source line DSLt.

As illustrated in FIG. 19D, a source gas such as conductive polysilicon is injected through the slit STs, so as to fill the gap between the lower source line DSLb and the upper source line DSLt, thereby forming an intermediate source line BSL such as a polysilicon layer. Accordingly, the source line SLs that represents the first conductive layer, containing the lower source line DSLb, the intermediate source line BSL, and the upper source line DSLt, is formed. The channel layer CN of the pillar PLs is connected at the side face with the intermediate source line BSL.

Thereafter by removing the insulating layer 59 and so forth on the side face of the slit STs in the memory region MR, and by subjecting the stacked body LMs to the replacement process through the slit STs, there is obtained a semiconductor memory device in which the channel layer CN is connected on the side face thereof to the intermediate source line BSL.

The aforementioned embodiment, the first modified example, and the second modified example are on the premise that the insulating layers NL and OL are alternately stacked to form the stacked body LMs. The stacked body LMs may, however, be formed separately by a plurality of tiers, in which the pillars PL, the columnar portions HR, and the stepped portions SP may be formed stepwise every time one tier of the stacked body LMs is formed. The number of the stacked word lines WL may further be increased in this way.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
    a first conductive layer;
    a stacked body including a plurality of second conductive layers and a plurality of first insulating layers alternately stacked one by one above the first conductive layer, and including a stepped portion in which the plurality of second conductive layers is terraced;
    a plurality of first pillars arranged in a memory region that is away from the stepped portion in a first direction that crosses a stacking direction of the stacked body, each first pillar including a semiconductor layer that penetrates the stacked body and connects with the first conductive layer, and forming a memory cell at an intersection with at least a part of the plurality of second conductive layers; and
    a plate-like portion including a third conductive layer that extends in the stacked body from the stepped portion to the memory region continuously in the stacking direction and in the first direction, the plate-like portion dividing the stacked body in a second direction that crosses both the stacking direction and the first direction, wherein
    the plate-like portion includes, in the stepped portion, a plurality of contact portions that is arranged intermittently in the first direction, the plurality of contact portions penetrating the stacked body and connecting with the first conductive layer.

2. The semiconductor memory device according to claim 1, wherein
    the plurality of contact portions is connected in the first direction at an upper position of the plate-like portion in the stepped portion, by the third conductive layer that extends in the first direction so as to divide a part of the plurality of second conductive layers in the second direction.

3. The semiconductor memory device according to claim 2, wherein
    in the stepped portion, the plate-like portion includes, in a lower portion thereof, a second insulating layer that is divided by the plurality of contact portions in the first direction.

4. The semiconductor memory device according to claim 3, wherein
    the second insulating layer is not arranged in a lower portion of the plate-like portion in the memory region, and
    the third conductive layer is connected to the first conductive layer in the first direction continuously in the memory region.

5. The semiconductor memory device according to claim 1, further comprising:
    a plurality of second pillars that is arranged in the stepped portion and extends through the stacked body in the stacking direction, wherein
    the plurality of contact portions is arranged while being off-aligned with a position opposed in the second direction with each of second pillars lined up in the first direction neighboring the plate-like portion, from among the plurality of second pillars.

6. The semiconductor memory device according to claim 5, wherein
    each of the plurality of contact portions has a width in the second direction, wider than a width of the other portion of the plate-like portion in the second direction.

7. The semiconductor memory device according to claim 5, wherein
    the plurality of first and second pillars is scatteringly arranged in the stacked body, and
    an arrangement density of the plurality of second pillars per unit area of the plurality of second conductive layers is lower than an arrangement density of the plurality of first pillars per the unit area.

8. The semiconductor memory device according to claim 7, wherein
    the plurality of first pillars is arranged staggered when viewed in the stacking direction, and
    the plurality of second pillars is arranged to form a grid pattern when viewed in the stacking direction.

9. The semiconductor memory device according to claim 1, wherein
    the plate-like portion includes:
    a first plate-like portion; and
    a second plate-like portion neighboring the first plate-like portion in the second direction, and
    the plurality of contact portions includes:
    a plurality of first contact portions included in the first plate-like portion; and
    a plurality of second contact portions included in the second plate-like portion, and individually arranged while being off-aligned with positions opposed in the second direction with the plurality of first contact portions.

10. The semiconductor memory device according to claim 9, wherein
    a distance between neighboring ones of the plurality of first contact portions is half or shorter than a distance between the first plate-like portion and the second plate-like portion.

11. The semiconductor memory device according to claim 1, wherein
    the plate-like portion includes:
    a first plate-like portion; and
    a second plate-like portion neighboring the first plate-like portion in the second direction, and
    the plurality of contact portions includes:
    a plurality of first contact portions included in the first plate-like portion; and
    a plurality of second contact portions included in the second plate-like portion, and individually arranged while being aligned in the second direction with the plurality of first contact portions.

12. The semiconductor memory device according to claim 11, wherein a distance between neighboring ones of the plurality of first contact portions is quarter or shorter than a distance between the first plate-like portion and the second plate-like portion.

13. A semiconductor memory device comprising:

a first conductive layer;

a stacked body including a plurality of second conductive layers and a plurality of first insulating layers alternately stacked one by one above the first conductive layer, and including a stepped portion in which the plurality of second conductive layers is terraced;

a plurality of first pillars arranged in a memory region that is away from the stepped portion in a first direction that crosses a stacking direction of the stacked body, each first pillar including a semiconductor layer that penetrates the stacked body and connects with the first conductive layer, and forming a memory cell at an intersection with at least a part of the plurality of second conductive layers; and a plate-like portion that extends in the stacked body from the stepped portion to the memory region continuously in the stacking direction and in the first direction, and divides the stacked body in a second direction that crosses both the stacking direction and the first direction, wherein the plate-like portion includes:

a sidewall insulating layer covering sidewalls that are opposed each other in the second direction of the plate-like portion; and a third conductive layer that extends inside the sidewall insulating layer from the stepped portion to the memory region continuously, and is electrically connected to the first conductive layer, and the sidewall insulating layer includes, in the stepped portion intermittently in the first direction, first portions each having a thickness larger than a thickness of a second portion other than the first portions in a direction that crosses the stacking direction.

14. The semiconductor memory device according to claim 13, wherein the sidewall insulating layer contains, in the first portions, a metal element-containing layer that extends in the sidewall insulating layer in the stacking direction, at a predetermined position in a thickness direction of the sidewall insulating layer.

15. The semiconductor memory device according to claim 14, wherein the metal element-containing layer is also arranged in the first portions, on a face, opposed to the second conductive layers, of the sidewall insulating layer.

16. The semiconductor memory device according to claim 15, wherein the metal element-containing layer is not arranged in the first portions, on a face, opposed to the first insulating layers, of the sidewall insulating layer.

17. The semiconductor memory device according to claim 15, wherein the metal element-containing layer is arranged in the second portion, on a face, opposed to the first insulating layers, of the sidewall insulating layer.

18. The semiconductor memory device according to claim 17, wherein the metal element-containing layer is not arranged in the second portion, on a face, opposed to the second conductive layers, of the sidewall insulating layer.

19. The semiconductor memory device according to claim 17, wherein the plate-like portion has, in the memory region, a layer structure same as that of the plate-like portion in the second portion.

20. The semiconductor memory device according to claim 13, wherein the plate-like portion in the second portion has a width in the second direction wider than that in the first portion at least in the stepped portion.

* * * * *